United States Patent
Ikriannikov et al.

(10) Patent No.: US 9,559,679 B2
(45) Date of Patent: Jan. 31, 2017

(54) INTEGRATED CIRCUITS INCLUDING MAGNETIC DEVICES

(71) Applicant: Volterra Semiconductor LLC, San Jose, CA (US)

(72) Inventors: Alexandr Ikriannikov, Castro Valley, CA (US); Andrew J. Burstein, Pleasanton, CA (US); Anthony J. Stratakos, Kentfield, CA (US)

(73) Assignee: Volterra Semiconductor, LLC, San Jose, CA (US)

( * ) Notice: Subject to any disclaimer, the term of this patent is extended or adjusted under 35 U.S.C. 154(b) by 0 days.

(21) Appl. No.: 14/797,392

(22) Filed: Jul. 13, 2015

(65) Prior Publication Data

US 2015/0318248 A1 Nov. 5, 2015

Related U.S. Application Data

(62) Division of application No. 13/706,171, filed on Dec. 5, 2012, now Pat. No. 9,083,332.

(51) Int. Cl.
*H03K 17/0412* (2006.01)
*H01F 27/28* (2006.01)
(Continued)

(52) U.S. Cl.
CPC ...... *H03K 17/0412* (2013.01); *H01F 27/2804* (2013.01); *H01L 23/645* (2013.01);
(Continued)

(58) Field of Classification Search
CPC .. H02M 3/1582; H02M 3/158; H01M 3/3376; H03K 17/0412; H03K 17/102; H03K 17/122; H01F 27/2804; H01F 27/24; H01F 2017/0086; H01F 2017/0066; H01F 2017/0053; H01L 23/645; H01L 23/576; H01L 23/66; H01L 25/16; H01L 25/0657; H01L 25/105; H01L 2224/16245; H01L 2224/48247; H01L 2224/73265; H01L 2924/13091; H01L 2924/18161; H01L 2924/1305; H01L 2924/00
See application file for complete search history.

(56) References Cited

U.S. PATENT DOCUMENTS 4,774,914 A * 10/1988 Ward ............... F02P 23/045
                                                  123/162
5,023,578 A    6/1991 Kaneko et al.
(Continued)

FOREIGN PATENT DOCUMENTS

JP         08-250332      9/1996

OTHER PUBLICATIONS

Texas Instruments TPS54900 Datasheet, Oct. 2001, 17 pages.
(Continued)

*Primary Examiner* — Nikolay Yushin
(74) *Attorney, Agent, or Firm* — Lathrop & Gage LLP

(57) ABSTRACT

An integrated circuit includes a semiconductor die including one or more switching circuits, a magnetic core having length and width, first and second metallic leads, and integrated circuit packaging material. The first metallic lead forms a first winding turn around a portion of the magnetic core, and the first metallic lead is electrically coupled to the semiconductor die. The second metallic lead forms a second winding turn around a portion of the magnetic core. The first and second winding turns are offset from each other along both of the width and length of the magnetic core. The integrated circuit is, for example, included in an integrated electronic assembly.

15 Claims, 25 Drawing Sheets

(51) Int. Cl.
*H01L 23/64* (2006.01)
*H01L 25/16* (2006.01)
*H01F 17/00* (2006.01)
*H02M 3/158* (2006.01)

(52) U.S. Cl.
CPC ............ *H01L 25/16* (2013.01); *H02M 3/158* (2013.01); *H02M 3/1582* (2013.01); *H01F 2017/0086* (2013.01); *H01L 2224/16245* (2013.01); *H01L 2924/1305* (2013.01); *H01L 2924/13091* (2013.01); *H01L 2924/18161* (2013.01)

(56) References Cited

U.S. PATENT DOCUMENTS

| | | | |
|---|---|---|---|
| 5,070,317 A * | 12/1991 | Bhagat | B81B 7/0077 257/531 |
| 5,161,098 A | 11/1992 | Balakrishnan | |
| 5,353,001 A | 10/1994 | Meinel et al. | |
| 5,469,334 A | 11/1995 | Balakrishnan | |
| 5,565,837 A | 10/1996 | Godek et al. | |
| 5,631,822 A | 5/1997 | Silberkleit et al. | |
| 5,694,030 A | 12/1997 | Sato et al. | |
| 6,362,986 B1 | 3/2002 | Schultz et al. | |
| 6,420,953 B1 | 7/2002 | Dadafshar | |
| 6,867,678 B2 | 3/2005 | Yang | |
| 7,157,891 B1 | 1/2007 | Drury et al. | |
| 7,187,263 B2 | 3/2007 | Vinciarelli | |
| 7,239,530 B1 | 7/2007 | Djekic et al. | |
| 7,259,648 B2 | 8/2007 | Matsutani et al. | |
| 7,315,463 B2 | 1/2008 | Schrom et al. | |
| 7,317,305 B1 | 1/2008 | Stratakos et al. | |
| 7,352,269 B2 | 4/2008 | Li et al. | |
| 7,425,883 B2 | 9/2008 | Matsutani et al. | |
| 7,498,920 B2 | 3/2009 | Sullivan et al. | |
| 7,504,808 B2 | 3/2009 | Schrom et al. | |
| 7,544,995 B2 | 6/2009 | Lotfi et al. | |
| 7,688,172 B2 | 3/2010 | Lotfi et al. | |
| 7,755,463 B2 | 7/2010 | Hopper et al. | |
| 7,786,837 B2 | 8/2010 | Hebert | |
| 7,994,888 B2 | 8/2011 | Ikriannikov | |
| 8,153,473 B2 | 4/2012 | Lotfi et al. | |
| 8,266,793 B2 | 9/2012 | Lotfi et al. | |
| 8,907,448 B2 * | 12/2014 | Chen | H01L 28/10 257/531 |
| 2007/0102805 A1 | 5/2007 | Kim et al. | |
| 2007/0296533 A1 | 12/2007 | Springett | |
| 2008/0237790 A1 | 10/2008 | Yabuzaki et al. | |
| 2008/0303125 A1 | 12/2008 | Chen et al. | |
| 2008/0309442 A1 | 12/2008 | Hebert | |
| 2009/0175014 A1 | 7/2009 | Zeng et al. | |
| 2009/0231081 A1 | 9/2009 | Ikriannikov et al. | |
| 2009/0237197 A1 | 9/2009 | Ikriannikov et al. | |
| 2010/0328010 A1 | 12/2010 | Noma et al. | |
| 2011/0018669 A1 | 1/2011 | Ikriannikov | |
| 2011/0032068 A1 | 2/2011 | Ikriannikov | |
| 2011/0035607 A1 | 2/2011 | Ikriannikov | |
| 2011/0043317 A1 | 2/2011 | Ikriannikov | |
| 2011/0050191 A1 | 3/2011 | Tsuji et al. | |
| 2011/0148559 A1 | 6/2011 | Ikriannikov | |
| 2011/0148560 A1 | 6/2011 | Ikriannikov | |
| 2011/0169476 A1 | 7/2011 | Ikriannikov | |
| 2011/0279100 A1 | 11/2011 | Ikriannikov | |
| 2012/0056703 A1 | 3/2012 | Ikriannikov | |
| 2014/0036464 A1 * | 2/2014 | Kilger | H01L 23/49822 361/767 |
| 2014/0061854 A1 * | 3/2014 | Chen | H01L 28/10 257/531 |

OTHER PUBLICATIONS

Texas Instruments TPS54290 Datasheet, Oct. 2009, 35 pages.
Intersil ISL8036 Datasheet, Oct. 18, 2010, 25 pages.
DiBene II et al., "A 400 Amp fully Integrated Silicon Voltage Regulator with in-die magnetically coupled embedded inductors," APEC 2010, Feb. 25, 2010, 25 pages.
Schrom et al., "A 60MHz 50W Fine-Grain Package-Integrated VR Powering a CPU from 3.3V," APEC 2010, Feb. 2010, 12 pages.

* cited by examiner

INTEGRATED CIRCUITS INCLUDING MAGNETIC DEVICES

This application is a divisional of U.S. patent application Ser. No. 13/706,171, filed Dec. 5, 2012, which is incorporated herein by reference.

BACKGROUND

Switching power converters are widely used as power supplies due to their relatively high efficiency and small size. For example, information technology devices, such as computing and telecommunication devices, generally include one or more DC-to-DC switching power converters to provide local power to one or more device components, such as to provide power to device processors or to device memory.

A switching power converter typically includes a switching circuit, an inductor, and a controller. The controller controls the switching circuit to repeatedly switch a voltage across the inductor between at least two different levels, thereby causing current through the inductor to repeatedly ramp up and down, resulting in power transfer between the converter's input and output ports. In many instances, the controller controls switching circuit operation to regulate one or more converter parameters, such as input or output voltage, input or output current, and/or input or output power.

Switching power converters were historically formed of a number of discrete components. Advances in integrated circuit technology, though, have enabled integration of numerous components in a single package, thereby reducing the number of discrete components required to form a switching power converter. Such component reduction helps reduce switching power converter size and also promotes converter performance by minimizing impedance and signaling delays associated with discrete component interconnections. Additionally, minimizing the number of discrete components through integration also typically promotes reliability, manufacturing simplicity, and low cost.

However, many conventional switching power integrated circuits do not include an inductor, due to the difficulty of incorporating magnetic devices in integrated circuits, using conventional technology. These integrated circuits must be coupled to a discrete inductor, thereby preventing complete converter integration.

On the other hand, conventional integrated circuits including inductors typically compromise on inductor performance, integrated circuit package size, and/or manufacturing complexity. For example, some conventional switching power converter integrated circuits include an inductor with a small magnetic core, or even no magnetic core at all, to achieve a desired package size. A small core (or no core), however, may prevent the inductor from achieving a sufficiently large inductance value, thereby impairing converter performance. Furthermore, a small magnetic core is often prone to magnetic saturation at high current levels, thereby limiting inductor current capability.

As another example, U.S. Pat. No. 7,688,172 to Lotfi et al. discloses a power module including a single winding inductor and a semiconductor die. The inductor's winding is formed, though, from several discrete components that must be joined during the module's manufacture. Thus, Lotfi's inductor is relatively complex to manufacture. Additionally, Lofti's discrete winding components are prone to electrically shorting to external components. Furthermore, the magnetic flux path in Lofti's inductor is poorly controlled, potentially causing electromagnetic interference and/or undesired heating of external components.

SUMMARY

In an embodiment, an integrated circuit includes a semiconductor die including one or more switching circuits, a magnetic core, a metallic lead wrapped around at least a portion of the magnetic core, and integrated circuit packaging material. The integrated circuit packaging material encapsulates the semiconductor die, the magnetic core, and a portion of the metallic lead, to form an integrated circuit package. The metallic lead has opposing first and second ends, where the first end is connected to the semiconductor die, and the second end terminates on an outer surface of the integrated circuit package.

In an embodiment, an integrated circuit includes a semiconductor die including one or more switching circuits, a magnetic core, a plurality of metallic leads wound through the magnetic core, and integrated circuit packaging material. The integrated circuit packaging material encapsulates the semiconductor die, the magnetic core, and a portion of the plurality of metallic leads, to form an integrated circuit package. At least one of the leads is electrically coupled to the semiconductor die, and the metallic leads are electrically isolated from each other within the integrated circuit package.

In an embodiment, an integrated circuit includes a semiconductor die including one or more switching circuits, a magnetic core having length and width, first and second metallic leads, and integrated circuit packaging material. The first metallic lead forms a first winding turn around a portion of the magnetic core, and the first metallic lead is electrically coupled to the semiconductor die. The second metallic lead forms a second winding turn around a portion of the magnetic core. The integrated circuit packaging material encapsulates the semiconductor die, the magnetic core, and portions of the first and second metallic leads, to form an integrated circuit package. The first and second winding turns are offset from each other along both of the width and length of the magnetic core.

In an embodiment, an integrated circuit includes a semiconductor die including one or more switching circuits, a magnetic core having length and width, first and second lead sets, and integrated circuit packaging material. The integrated circuit packaging material encapsulates the semiconductor die, the magnetic core, and a portion of the first and second lead sets, to form an integrated circuit package. Each lead set includes a plurality of metallic leads, where each metallic lead is wound around a portion of the magnetic core in the lengthwise direction of the magnetic core. At least one of the metallic leads is electrically coupled to the semiconductor die. The first and second lead sets are non-overlapping and separated by a first separation distance, greater than each separation distance between adjacent metallic leads of the first and second lead sets, along the width of the magnetic core.

In an embodiment, an integrated electronic assembly includes a substrate including a cut-out portion, first and second semiconductor dies, an inductor, metallic connection circuitry electrically coupling the first and second semiconductor dies and the inductor, and packaging material. The first and second semiconductor dies are disposed on the substrate, and the first semiconductor die includes one or more switching circuits. The inductor includes a magnetic core extending at least partially into the cut-out portion of the substrate. The packaging material encapsulates at least a portion of the substrate, the first and second semiconductor dies, the inductor, and the metallic connection circuitry, to form an assembly package.

In an embodiment, an integrated electronic assembly includes a substrate, first and second semiconductor dies disposed on the substrate, a heat sink plate disposed on the first and second semiconductor dies, an inductor, metallic connection circuitry, and packaging material. The first semiconductor die includes one or more switching circuits. The heat sink plate includes a cut-out portion, and the inductor includes a magnetic core disposed on the substrate and extending at least partially into the cut-out portion. The metallic connection circuitry electrically couples the first and second semiconductor dies and the inductor, and the packaging material encapsulates at least part of the substrate, the first and second semiconductor dies, the inductor, and the first metallic connection circuitry, to form an assembly package.

In an embodiment, an integrated electronic assembly includes a substrate and an integrated circuit disposed on the substrate. The integrated circuit includes a first semiconductor die including one or more switching circuits, a magnetic core, and a metallic lead wrapped around at least a portion of the magnetic core. The metallic lead has a first end connected to the semiconductor die and a second end, opposite of the first end, connected to the substrate.

In an embodiment, an integrated electronic assembly includes a substrate and an integrated circuit disposed on the substrate. The integrated circuit includes a first semiconductor die including one or more switching circuits, a magnetic core having length and width, and first and second metallic leads. The first metallic lead forms a first winding turn around a portion of the magnetic core, and the first metallic lead is electrically coupled to the semiconductor die. The second metallic lead forms a second winding turn around a portion of the magnetic core. The first and second winding turns are offset from each other along both of the width and length of the magnetic core.

In an embodiment, an integrated electronic assembly includes a substrate including conductive traces and an integrated circuit disposed on the substrate. The integrated circuit includes a first semiconductor die including one or more switching circuits, a magnetic core having length and width, and first and second windings electrically coupled to the first semiconductor die. Each winding includes a plurality of metallic leads electrically coupled in series by the conductive traces of the substrate, and each metallic lead is wound around a portion of the magnetic core in a lengthwise direction of the magnetic core. The first and second windings are non-overlapping and separated by a first separation distance, greater than each separation distance between adjacent metallic leads of the first and second windings, along the width of the magnetic core.

In an embodiment, a method for manufacturing an integrated circuit including a magnetic device includes the following steps: (1) separately manufacturing a main portion of the integrated circuit and a magnetic portion of the integrated circuit, (2) joining the main and magnetic portions of the integrated circuit to form one or more windings, and (3) after the step of joining, packaging the main and magnetic portions of the integrated circuit. The main portion includes a semiconductor die attached to a lead frame, and the magnetic portion includes a magnetic core and at least one metallic lead wound on or through the magnetic core. The one or more windings include at least a portion of the lead frame and at least one lead.

DETAILED DESCRIPTION OF THE EMBODIMENTS

Disclosed herein are integrated circuits including magnetic devices, such as inductors. Certain embodiments include a metallic lead frame that is used as both a magnetic device winding and an electrical interface to a semiconductor die. Some other embodiments include a magnetic core extending into a substrate cut-out portion or a heat sink plate cut-out portion. As discussed below, these embodiments may achieve one or more advantages over conventional integrated circuits.

Figure 1:
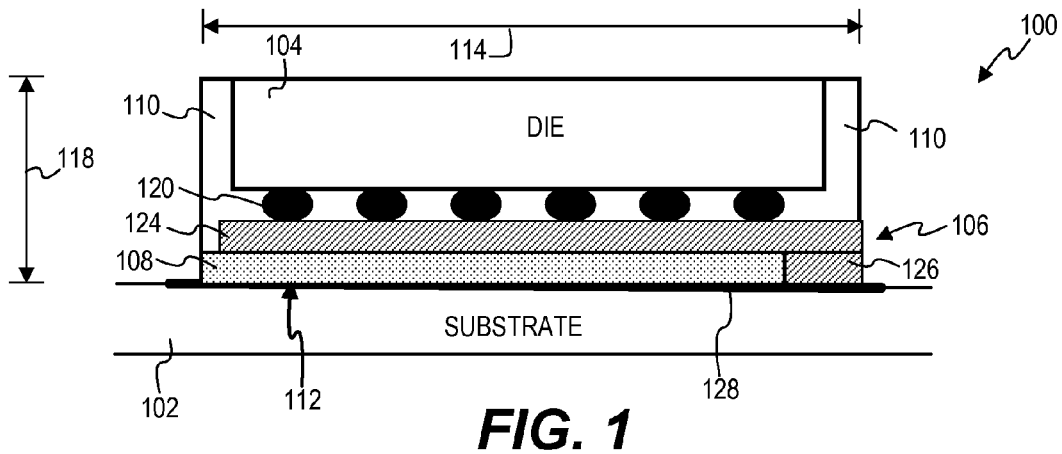
FIG. 1 shows a cross-sectional view of an integrated circuit disposed on a substrate, where the integrated circuit includes a semiconductor die stacked over a magnetic core, according to an embodiment.
Figure 2:
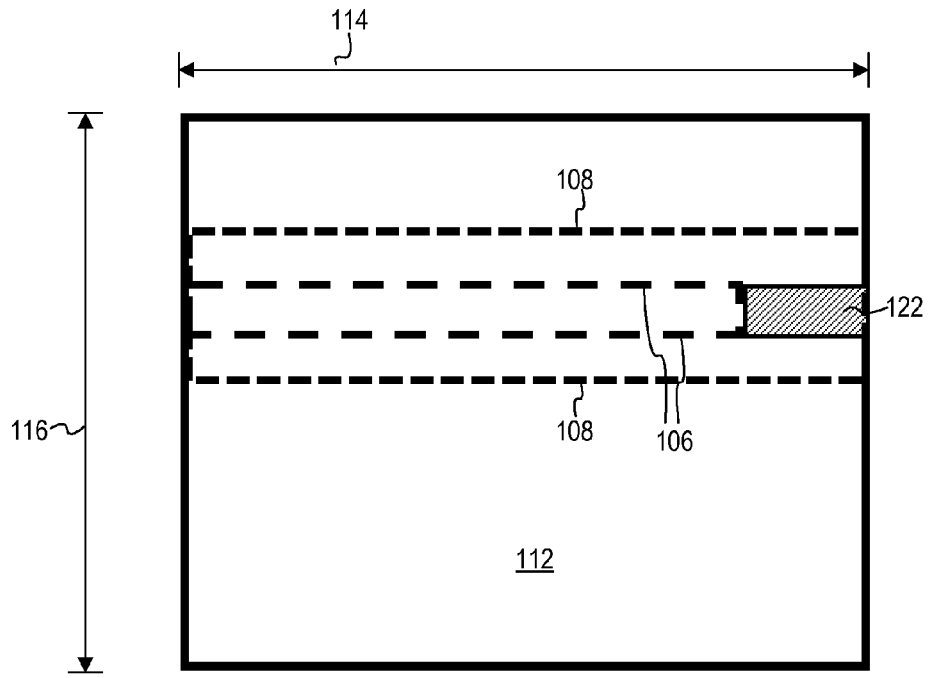
FIG. 2 shows a plan view of a bottom outer surface of the FIG. 1 integrated circuit.
Figure 3:
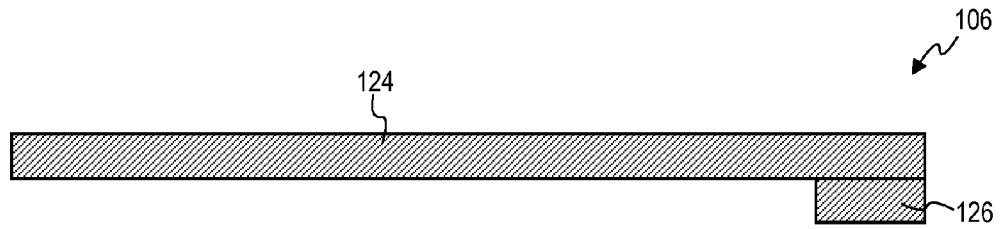
FIG. 3 shows a side elevational view of a lead of the FIG. 1 integrated circuit.

FIG. 1 shows a cross-sectional view of an integrated circuit 100 disposed on a substrate 102. Integrated circuit 100 includes a flip-chip semiconductor die 104, a lead frame including a metallic lead 106, a magnetic core 108, and integrated circuit packaging material 110. Integrated circuit packaging material 110 encapsulates die 104, magnetic core 108, and a portion of the lead frame, to form a quad-flat no-leads (QFNL) integrated circuit package including a bottom outer surface 112 facing substrate 102. In some embodiments, integrated circuit packaging material 110 includes a polymer material molded around die 104, lead 106, and magnetic core 108, by an injection molding process. FIG. 2 shows a plan view of bottom outer surface 112, with the outlines of lead 106 and magnetic core 108 shown by dashed lines. FIG. 3 shows an elevational view of lead 106, which is typically formed of a single piece of metal. Integrated circuit 100 has a length 114, a width 116, and a height 118, as shown.

Die 104 is stacked on a portion of lead 106, and the portion of lead 106 is stacked on magnetic core 108, such that integrated circuit 100 has vertically stacked configuration. Lead 106 has opposing first and second ends 124, 126. First end 124 is connected to die 104 via solder balls 120, and second end 126 terminates on outer surface 112 and forms a solder tab 122 on the surface. Solder tab 122 is a terminal adapted for surface mount soldering to substrate 102, to provide an electrical interface to integrated circuit 100. Lead 106 is wrapped around a portion of magnetic core 108 to form a winding turn around the core. Thus, lead 106 and magnetic core 108 collectively form an inductor within integrated circuit 100. In some embodiments, the inductor's winding is extended by a conductor 128 on substrate 102, as shown in FIG. 1. Conductor 128 is connected to solder tab 122 and is disposed under core 108, such that conductor 128 is effectively wound on core 108 and forms part of the inductor's winding. Substrate 102 is, for example, a printed circuit board, and conductor 128 is, for example, a printed circuit board conductive "trace."

Figure 4:
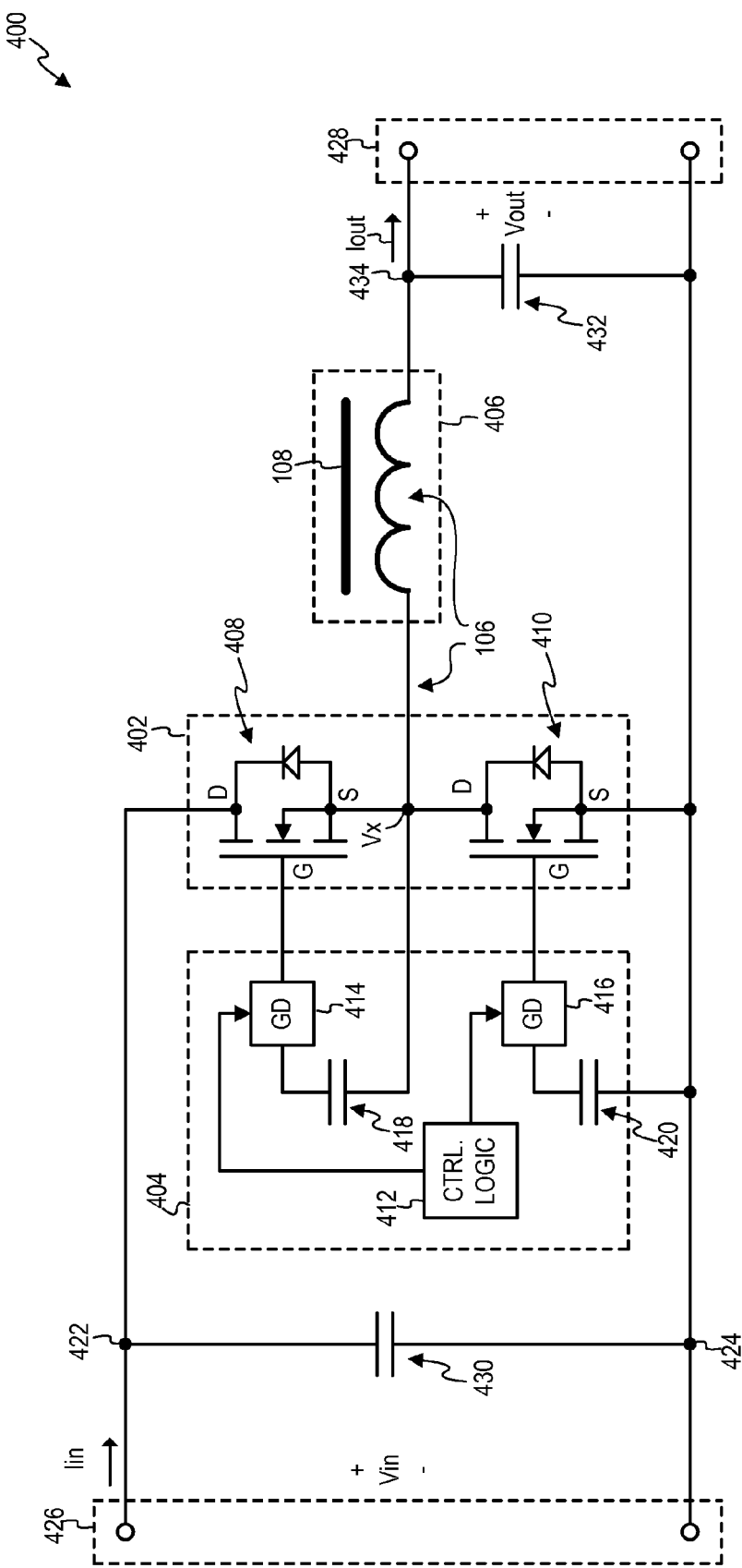
FIG. 4 shows a schematic of a switching power converter at least partially formed by some embodiments of the FIG. 1 integrated circuit.

Integrated circuit 100 forms at least part of switching power converter. For example, FIG. 4 shows a schematic of a buck DC-to-DC switching power converter 400, which is at least partially formed by certain embodiments of integrated circuit 100. In these embodiments, die 104 includes a switching circuit 402 and a controller 404. Lead 106 is electrically coupled to switching circuit 402, and lead 106 and magnetic core 108 collectively form an inductor 406 in integrated circuit 100. Switching circuit 402 includes a control transistor 408 and a freewheeling transistor 410 electrically coupled in series between an input power rail 422 and a reference power rail 424. The two transistors are joined at switching node Vx. In this embodiment, each transistor 408, 410 is an n-channel, enhancement mode, metal oxide field effect transistor (MOSFET), as shown. However, transistors 408, 410 are not limited to such MOSFETs, but instead could be another type of transistor, such as a p-channel MOSFET, or a bipolar junction transistor. Additionally, transistors 408, 410 could be replaced with another type of switching device without departing from the scope hereof.

Controller 404 includes control logic 412, first driver circuitry 414, and second driver circuitry 416. First driver circuitry 414 drives a gate-to-source voltage of control transistor 408 between two different voltage rails to cause the transistor to switch between its conductive and non-conductive states. Similarly, second driver circuitry 416 drives a gate-to-source voltage of freewheeling transistor 410 between two different voltage rails to cause the transistor to switch between its conductive and non-conductive states. Controller 404 further includes first and second driver capacitors 418, 420, which are electrically coupled to first and second driver circuitry 414, 416, respectively. First capacitor 418 supplies the high frequency current associated with charging and discharging the gate of control transistor 408, and second capacitor 420 supplies the high frequency current associated with charging and discharging the gate of freewheeling transistor 410. Accordingly, capacitors 418, 420 should be located near their respective driver circuitry 414, 416 to minimize impedance between the capacitors and their driver circuitry. Such impedance may cause voltage distortion, potentially resulting in electromagnetic compatibility issues and/or improper converter 400 operation. Furthermore, impedance between capacitors 418, 420 and their respective driver circuitry 414, 416 may slow switching of transistors 408, 410, by impeding charging and discharging of gate capacitance. Slow switching, in turn, may lead to "shoot-thru," where both transistors 408, 410 simultaneously conduct, potentially resulting in significant losses.

In alternate embodiments where control and freewheeling transistors 408, 410 are replaced with other types of transistors, first and second driver circuitry 414, 416 are modified, as appropriate, to provide the necessary signals to cause the transistors to switch between their conductive and non-conductive states. For example, in certain alternate embodiments, control and freewheeling transistors 408, 410 are replaced with bipolar junction transistors, and first and second driver circuitry 414, 416 are modified to generate the necessary base current signals to cause the bipolar junction transistors to switch between their conductive and non-conductive states.

Control logic 412 controls operation of driver circuitry 414, 416 to cause control and freewheeling transistors 408, 410 of switching circuit 402 to repeatedly switch node Vx between at least positive input power rail 422 and reference power rail 424, typically at a frequency of 100 kHz or greater. The switching action causes current through inductor 406 to repeatedly ramp up and down, thereby transferring power between converter input port 426 and output port 428. In some embodiments, control logic 412 is adapted to control switching circuit 402 operation to regulate one or more converter parameters, such as input voltage Vin, input current Iin, input power, output voltage Vout, output current Iout, and/or output power.

Switching power converter 400 typically further includes an input capacitor 430 electrically coupled between input power rail 422 and reference power rail 424. Although not required, input capacitor 430 is typically located within integrated circuit 400 near switching circuit 402, to minimize impedance in the path between input capacitor 430 and switching circuit 402. Excessive impedance in this path may cause slow current commutation, which is switching between control and freewheeling transistors 408, 410, thereby resulting in high switching losses. High impedance in this path may also cause excessive parasitic ringing, potentially resulting in electromagnetic compatibility issues and/or control difficulties. Converter 400 also optionally includes an output capacitor 432 electrically coupled between output power rail 434 and reference power rail 424. Output capacitor 432 absorbs ripple current generated by switching circuit 402 operation, and the capacitor may also supply high frequency components of output current Iout. Capacitor 432 is optionally omitted in applications where a load (not shown) electrically coupled to output port 428 includes sufficient capacitance to filter ripple current and to supply high frequency load current.

Freewheeling transistor 410 is optionally replaced with a freewheeling diode to reduce complexity, with the possible tradeoff of reduced efficiency. In some alternate embodiments, switching power converter 400 has a topology other than a buck DC-to-DC converter topology. For example, in certain alternate embodiments, switching power converter 400 has a boost DC-to-DC converter topology, and in certain other alternate embodiments, switching power converter 400 has a buck-boost DC-to-DC converter topology. Additionally, integrated circuit 100 may include additional circuitry, and/or possess additional functionality, without departing from the scope hereof. For example, in some embodiments, die 104 further includes telemetry circuitry, which enables integrated circuit 100 to communicate with external systems.

It should be understood that the lead frame of integrated circuit 100 will typically include a number of leads in addition to lead 106, such as to provide electrical interface to additional nodes of integrated circuit 100. These additional leads are not shown, though, to promote illustrative clarity. For example, in applications where integrated circuit 100 forms DC-to-DC switching power converter 400 (FIG. 4), integrated circuit 100 typically includes additional leads and solder tabs to provide electrical interface to input power rail 422, reference power rail 424, and various control nodes of controller 404.

Some alternate embodiments of integrated circuit 100 include an additional magnetic core and metallic lead pair, configured similarly to core 108 and lead 106, to form a second inductor in integrated circuit 100, in addition to the first inductor formed from core 108 and lead 106. The second inductor is part of, for example, a second switching power converter at least partially formed by integrated circuit 100, such as a second instance of converter 400 (FIG. 4). Alternately, the first and second inductors may be part of a single switching power converter including two parallel-coupled power stages, where each inductor is part of a respective one of the power stages. The two power stages are, for instance, switched out-of-phase with respect to each other, to achieve ripple current cancellation, thereby forming a multi-phase switching power converter, such as a converter similar to multi-phase buck DC-to-DC converter 2100 discussed below with respect to FIG. 21.

In some embodiments including first and second inductors, the magnetic cores are separated within integrated circuit 100 to minimize magnetic interaction between the inductors, such as in embodiments where each inductor is part of an independent switching power converter. On the other hand, in some other embodiments including first and second inductors, the inductors are magnetically coupled to form a coupled inductor. Magnetic coupling is achieved, for example, by disposing the cores in close proximity to each other in integrated circuit 100, typically with a small air gap between the cores. Alternately, the first and second inductors could be formed of a single magnetic core with two leads, where each lead forms a respective winding of the inductor. The single magnetic core is, for instance, formed of powder magnetic material or moldable magnetic material, including a distributed air gap. The second lead should terminate on an opposite side of the integrated circuit package than the first lead to achieve out-of-phase or inverse coupling in typical applications. Use of a coupled inductor in a multi-phase switching power converter, instead of multiple discrete inductors, may achieve one or more advantages, such as improved efficiency and/or improved transient response, as discussed further below.

Referring back to FIG. 1, in certain alternate embodiments of integrated circuit 100, the lead frame includes additional metallic leads wound on or through at least a portion of magnetic core 108. The additional leads are electrically coupled, for example, to form a multi-turn winding. Furthermore, although integrated circuit 100 is shown having a vertically stacked configuration, integrated circuit 100 could be modified to have a horizontally stacked configuration, where die 104 and magnetic core 108 are disposed side-by-side over different respective portions of bottom outer surface 112.

Figure 5:
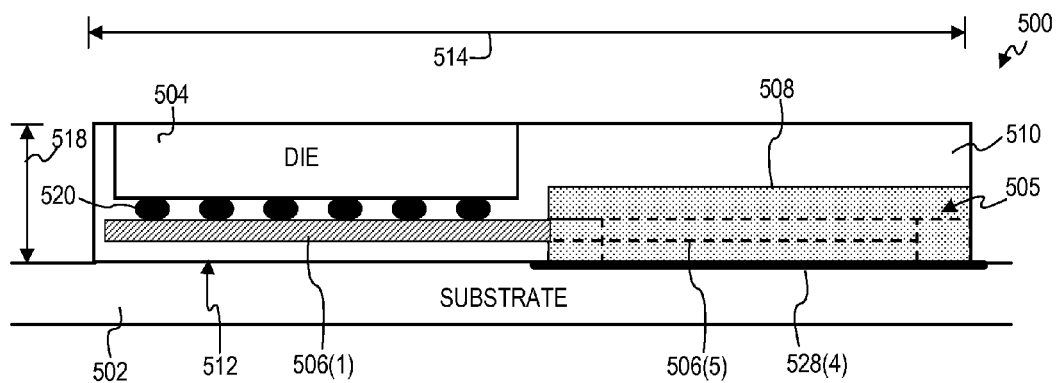
FIG. 5 shows a cross-sectional view of an integrated circuit disposed on a substrate, where the integrated circuit includes a semiconductor die disposed beside a magnetic core, according to an embodiment.
Figure 6:
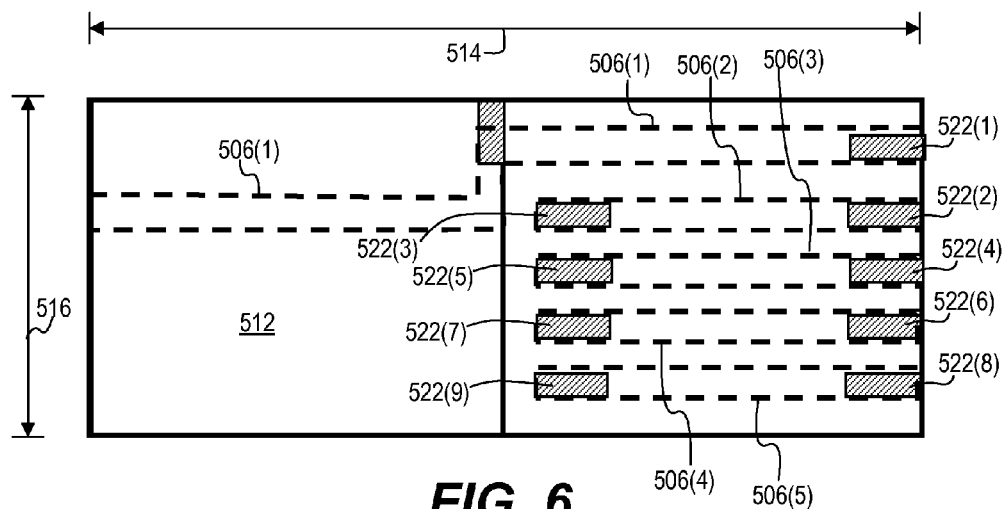
FIG. 6 shows a plan view of a bottom outer surface of the FIG. 5 integrated circuit.

For example, FIG. 5 shows a cross-sectional view of an integrated circuit 500 disposed on a substrate 502. Integrated circuit 500 includes a flip-chip semiconductor die 504, a lead frame 505, a magnetic core 508, and integrated circuit packaging material 510. Integrated circuit packaging material 510 encapsulates die 504, magnetic core 508, and a portion of lead frame 505, to form a QFNL integrated circuit package including a bottom outer surface 512 facing substrate 502. In some embodiments, integrated circuit packaging material 510 includes a polymer material molded around die 504, lead frame 505, and magnetic core 508, by an injection molding process. FIG. 6 shows a plan view of bottom outer surface 512. Integrated circuit 500 has a length 514, a width 516, and a height 518, as shown.

Die 504 is stacked on a portion of lead frame 505, and die 504 is electrically coupled to the lead frame by solder balls 520. However, in contrast to integrated circuit 100, die 504 is disposed beside magnetic core 508 along length 514, and die 504 and core 508 are disposed over different respective portions of bottom outer surface 512. Such horizontally stacked configuration promotes low height 518, with the tradeoff of increased length 514. Alternately, the horizontally stacked configuration allows the magnetic core to have a taller height than the vertically stacked configuration, at a given integrated circuit package height.

Figure 7:
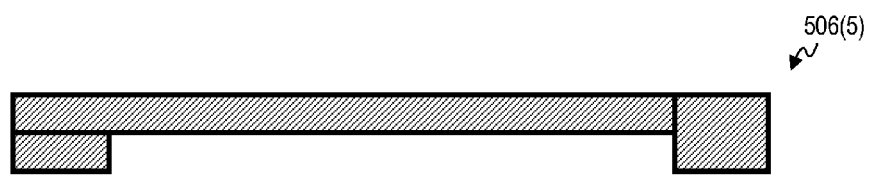
FIG. 7 shows a side elevational view of a lead of the FIG. 5 integrated circuit.

Lead frame 505 includes several metallic leads 506. In this document, specific instances of an item may be referred to by use of a numeral in parentheses (e.g., metallic lead 506(1)), while numerals without parentheses refer to any such item (e.g., leads 506). The outlines of leads 506 are shown by dashed lines in FIG. 6 where not visible in the plan view. Lead 506(1) is electrically coupled to die 504 and wound through a portion of magnetic core 508. An end of lead 506(1) terminates on bottom outer surface 512 to form a solder tab 522(1) on the surface 512. Leads 506(2)-506(5) are also each wound through a portion of magnetic core 508, and their ends terminate on outer surface 512 to form respective solder tabs 522 on the surface. Solder tabs 522 are terminals adapted for surface mount soldering to substrate 502. Leads 506(2)-506(5) are essentially identical to each other and have a "staple" shape, as shown in FIG. 7, which is an elevational view of lead 506(5). Leads 506(2)-506(5) are electrically isolated from each other, as well as from lead 506(1) and die 504, within integrated circuit 500. It is anticipated, though, that in many applications, leads 506 will be electrically coupled in series by conductors external to integrated circuit 500, to form a multi-turn winding.

Figure 8:
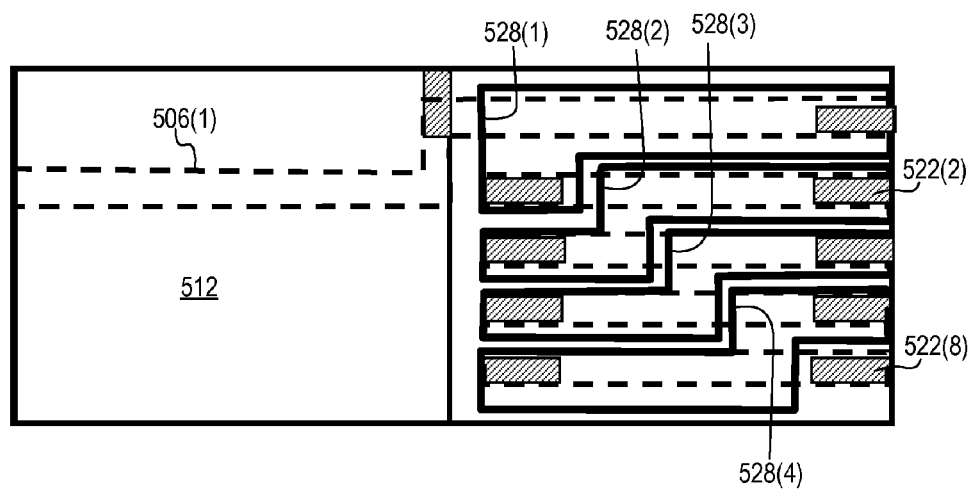
FIG. 8 illustrates one possible manner in which external conductors may be used to connect leads of the FIG. 5 integrated circuit.

For example, FIG. 8 illustrates one possible manner of connecting leads 506 in series to form a multi-turn winding. Specifically, FIG. 8 shows bottom outer surface 512 with outlines of external conductors 528 electrically coupling leads 506 in series to form a five-turn winding. Conductor 528(1) connects leads 506(1) and 506(2), conductor 528(2) connects leads 506(2) and 506(3), conductor 528(3) connects leads 506(3) and 506(4), and conductor 528(4) connects leads 506(4) and 506(5). Conductors 528 are typically conductive traces of substrate 502. Magnetic core 508 and series-coupled leads 506 collectively form an inductor with five winding-turns, where each lead 506 forms a respective winding turn. The inductor and die 504 collectively form a switching power converter, such as a converter similar to converter 400 of FIG. 4. Use of multiple winding-turns promotes large inductance values at low magnetic flux density. Accordingly, a multi-turn inductor may enable use of a smaller magnetic core, and/or achieve lower core losses, than an otherwise similar inductor with only a single winding-turn. Although integrated circuit 500 is shown with five leads 506, the number of leads may be varied without departing from the scope hereof. For instance, one alternate embodiment includes six leads 506, to enable forming a six winding-turn inductor. Additionally, the configuration of conductors 528, such as their geometry, could be changed, without departing from the scope hereof.

Lead frame 505 typically includes additional leads providing electrical interface to additional nodes of integrated circuit 500, such as power and communication nodes, in a manner similar to that discussed above with respect to integrated circuit 100. These additional leads are not shown, though, to promote illustrative clarity.

Figure 9:
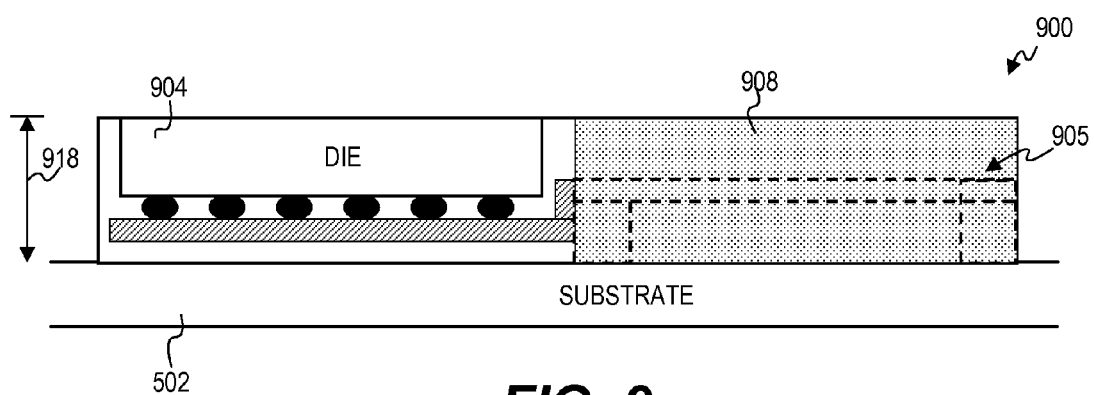
FIG. 9 shows a cross-sectional view of an integrated circuit disposed on a substrate, where the integrated circuit is similar to the FIG. 5 integrated circuit, but includes a larger magnetic core, according to an embodiment.

FIG. 9 shows a cross-sectional view of an integrated circuit 900, which is similar to integrated circuit 500 (FIG. 5), but includes a magnetic core 908 occupying substantially all of integrated circuit height 918. The large size of core 908, relative to core 508 of integrated circuit 500, results in the inductor of integrated circuit 900 having lower core losses than the inductor of circuit 500, assuming all else is equal. The portion of lead frame 905 wound through magnetic core 908 is vertically offset from the portion of lead frame 905 connected to die 904, to help achieve balanced reluctance along the magnetic flux path.

As discussed above, conductors 528 shown in FIG. 8 are typically substrate conductive traces, such as printed circuit board traces. The traces are often only one third of the thickness of lead frame 505, and the traces therefore generally have a relatively high resistance. Thus, conductors 528 may experience high resistive losses at high current levels. Accordingly, some alternate embodiments of integrated circuit 500 include one or more solder tabs on bottom outer surface 512 to help minimize length of external conductors when connecting leads 506 to form a multi-turn winding.

Figure 10:
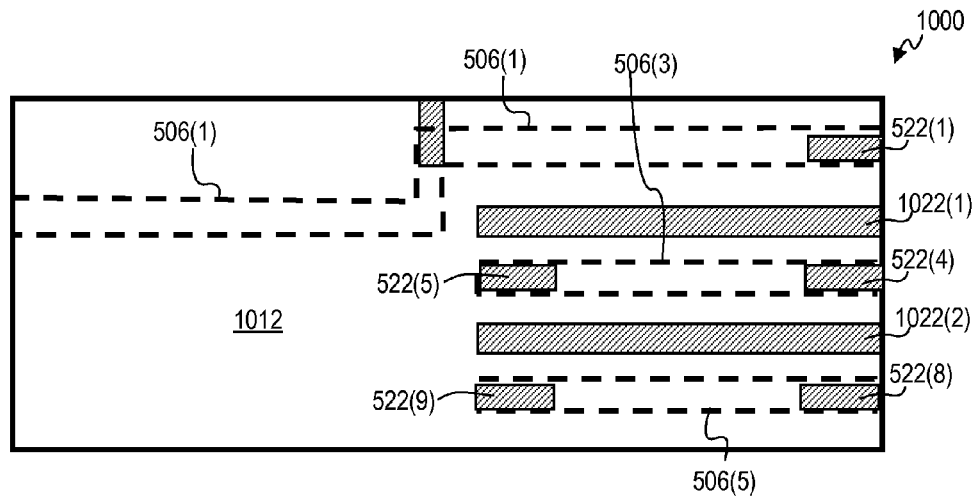
FIG. 10 shows a plan view of a bottom outer surface of an integrated circuit similar to that of FIG. 5, but with two leads replaced by solder tabs, according to an embodiment.

For example, FIG. 10 shows a plan view of a bottom outer surface 1012 of an integrated circuit 1000. Integrated circuit 1000 is similar to integrated circuit 500 of FIG. 5, but includes two additional solder tabs 1022 in place of two leads 506. Solder tabs 1022 are used, for example, to minimize the length of external conductors, such as printed circuit board conductive traces, electrically connecting leads 506 in series. Solder tabs 1022 typically have a thickness similar to that of an integrated circuit lead frame, and a given solder tab 1022 will therefore have a much lower resistance than a common printed circuit board trace of similar length and width. Accordingly, use of solder tabs 1022 for interconnections in place of conductive traces may significantly reduce resistive losses at high current levels.

Figure 11:
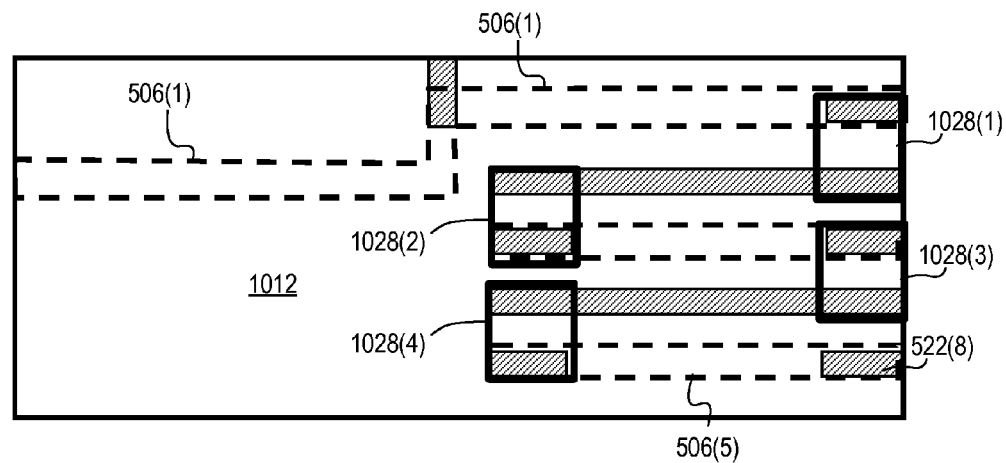
FIG. 11 illustrates one possible manner in which external conductors may be used to connect leads of FIG. 10 integrated circuit.

For instance, FIG. 11 shows one possible manner in which solder tabs 1022 can be used to reduce length of circuit traces connecting leads 506. FIG. 11 illustrates bottom outer surface 1012 with the outlines of external conductors 1028 electrically coupling leads 506 in series to form a multi-turn winding. Conductors 1028 are typically conductive traces of substrate 502. Conductor 1028(1) connects lead 506(1) and solder tab 1022(1), conductor 1028(2) connects solder tab 1022(1) and lead 506(3), conductor 1028(3) connects lead 506(3) and solder tab 1022(2), and conductor 1028(4) connects solder tab 1022(2) and lead 506(5). Conductors 1028 are significantly shorter than conductors 528 of FIG. 8, and the FIG. 11 configuration will therefore typically have smaller resistive losses than the FIG. 8 configuration, assuming all else is equal. However, replacing two leads 506 with solder tabs 1022 reduces the number of winding turns, so that the FIG. 11 configuration forms a three winding-turn inductor, instead of the five winding-turn inductor of FIG. 8. Specifically, while all metallic leads 506 in the FIG. 8 configuration conduct current in the same direction and thereby form respective winding turns, solder tabs 1022 of FIG. 11 instead return current from one core edge to the other, without forming winding turns. Thus, the efficiency improvement achieved by adding bottom surface solder tabs comes at the price of potentially reducing the number of winding turns, assuming metallic lead pitch remains unchanged.

Figure 12:
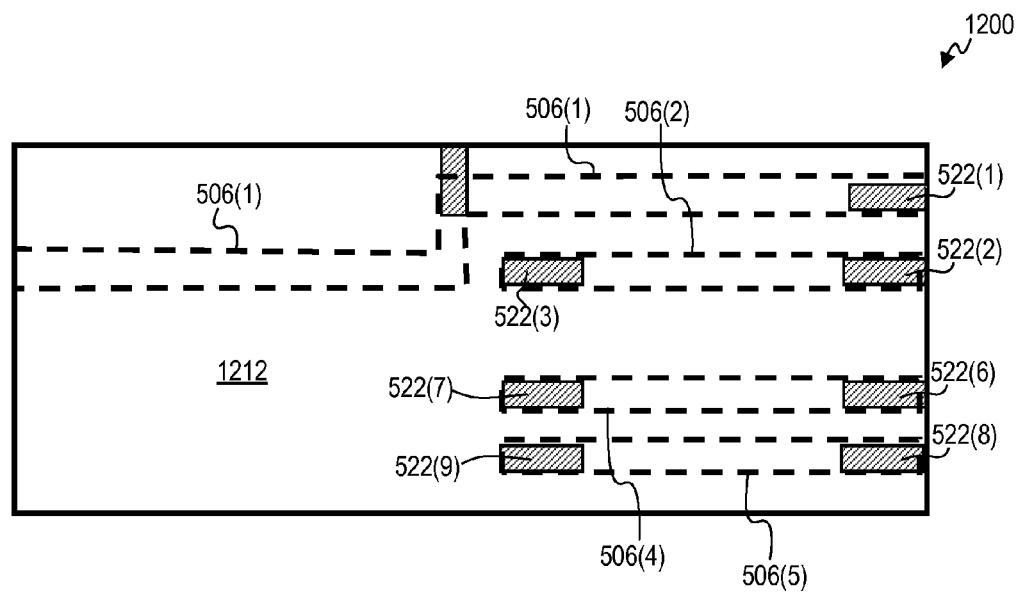
FIG. 12 shows a plan view of a bottom outer surface of an integrated circuit like that of FIG. 5, but with one lead omitted, according to an embodiment.
Figure 13:
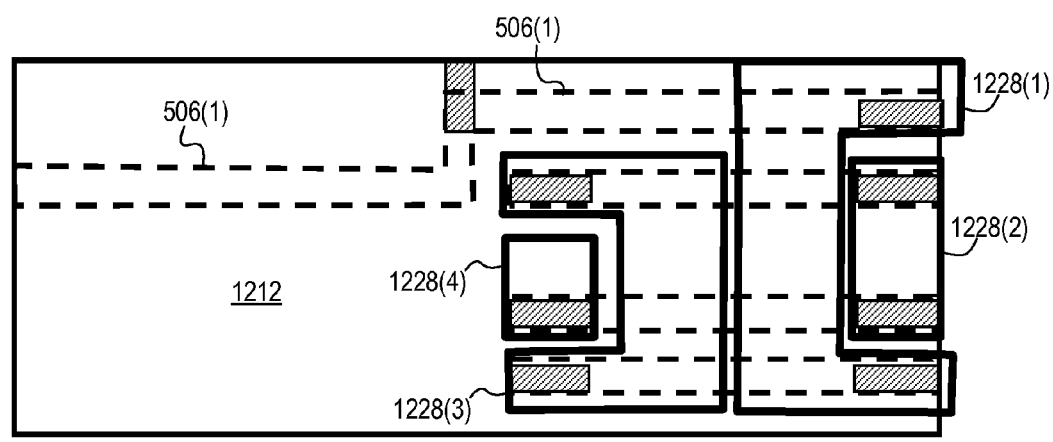
FIG. 13 illustrates one possible manner in which external conductors may be used to connect leads of the FIG. 12 integrated circuit.

The number of leads 506 of integrated circuit 500 can also be reduced to increase flexibility in coupling the leads using external conductors, with the trade-off of fewer winding-turns. For example, FIG. 12 shows a plan view of a bottom outer surface 1212 of an integrated circuit 1200. Integrated circuit 1200 is like integrated circuit 500 of FIG. 5, but with lead 506(3) omitted. FIG. 13 illustrates one possible manner in which external conductors 1228 which are, for example, conductive traces, may be used to connect leads 506 to form a four-turn winding. As shown, conductors 1228(2), 1228(4) are short, thereby promoting low losses. While conductors 1228(1), 1228(3) are relatively long, they are also relatively wide, thereby further promoting low losses.

Although integrated circuit 1200 is like integrated circuit 500 of FIG. 5, the two integrated circuits may have different magnetic flux paths in certain applications. For example, when integrated circuit 500 is configured according to FIG. 8, current flowing through magnetic core 508 flows in a single direction. Accordingly, magnetic flux flowing through the bottom portion of core 508 flows in a first direction, while magnetic flux flowing through the top portion of the core flows in an opposite direction. In contrast, when integrated circuit 1200 is configured according to FIG. 13, current flows through leads 506(1), 506(2) in one direction, and current flows through leads 506(4), 506(5) in an opposite direction. Thus, magnetic flux flows in a first direction through a center core portion between leads 506(2) and 506(4), and magnetic flux flows in an opposite direction in outer core portions between leads 506(1), 506(5) and their adjacent core edges.

Figure 14:
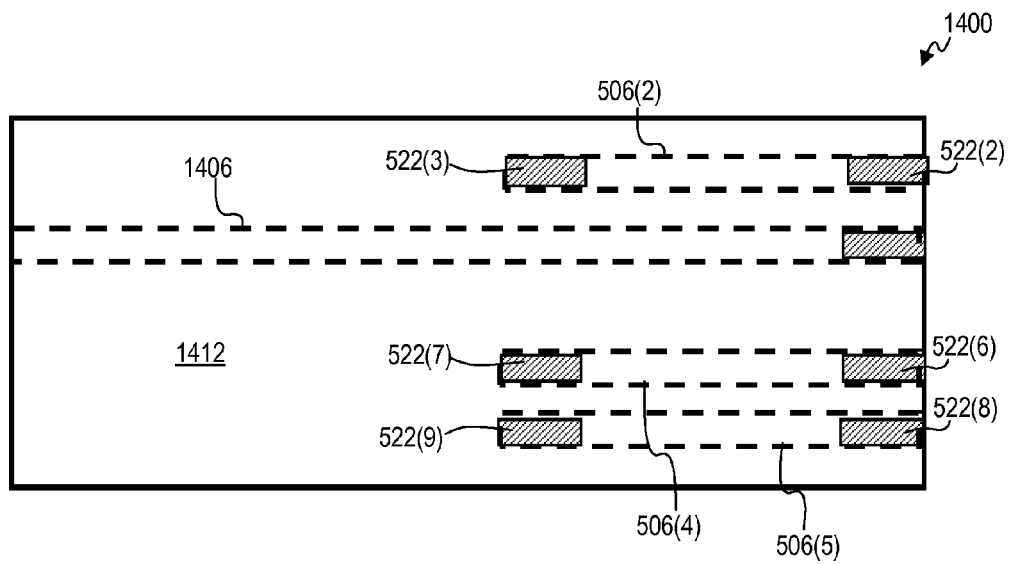
FIG. 14 shows a plan view of a bottom outer surface of an integrated circuit similar to that of FIG. 5, but with a different lead configuration, according to an embodiment.
Figure 15:
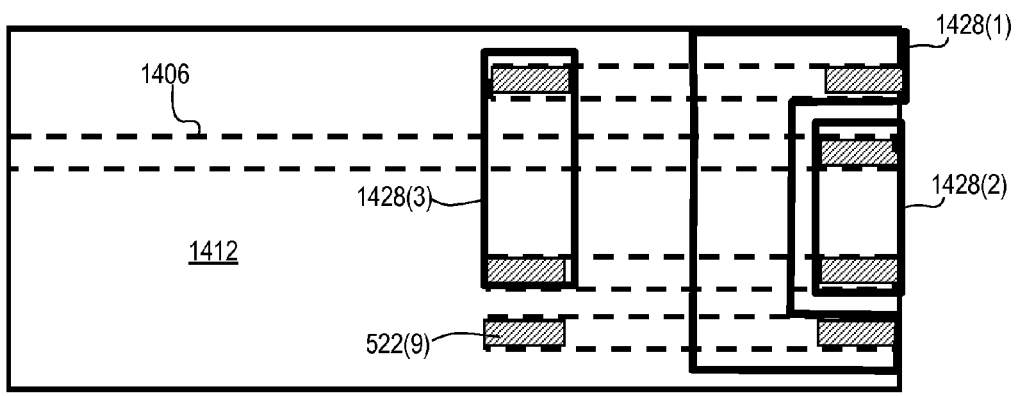
FIG. 15 illustrates one possible manner in which external conductors may be used to connect leads of the FIG. 14 integrated circuit.

FIG. 14 shows a plan view of a bottom outer surface 1412 of an integrated circuit 1400. Integrated circuit 1400 is similar to integrated circuit 500 of FIG. 5, but has a slightly different lead configuration, where lead 506(2) is moved towards the package edge, lead 506(3) is omitted, and lead 506(1) is replaced with lead 1406 extending straight along length 514 to electrically couple to die 504. This configuration enables integrated circuit 1400 to form a four winding-turn inductor using only three external conductors, thereby helping minimize external conductor loss. For instance, FIG. 15 illustrates one possible manner in which external conductors 1428 may be used to series-connect leads 506, 1406 to form a four winding-turn inductor. Connector 1428(2) connects leads 1406, 506(4), connector 1428(3) connects leads 506(4), 506(2), and connector 1428(1) connects leads 506(2), 506(5). As shown, conductors 1428(2), 1428(3) are short, thereby promoting low losses. Although conductor 1428(1) is relatively long, it is also relatively wide, thereby also promoting low losses.

An integrated circuit's lead frame may also form at least part of a coupled inductor. As discussed, for example, in U.S. Pat. No. 6,362,986 to Schultz et al., which is incorporated herein by reference, use of coupled inductors in switching power converters may achieve a number of advantages. For instance, use of a coupled inductor, instead of multiple discrete (uncoupled) inductors, promotes ripple current cancellation in switching devices and fast converter transient response. Additionally, a coupled inductor having a given maximum current rating will typically occupy less space than multiple discrete inductors which collectively achieve the same maximum current rating. Accordingly, use of a coupled inductor, instead of multiple discrete inductors, may enable a reduction in package volume portion occupied by magnetic devices. As Schultz discusses, there must be strong magnetic coupling between windings to fully realize the advantages of using a coupled inductor. However, leakage inductance must also be large enough to prevent excessive ripple current magnitude, but not so large as to negatively impact converter transient response. Thus, leakage inductance must be within a particular value range to achieve high switching power converter performance.

Figure 16:
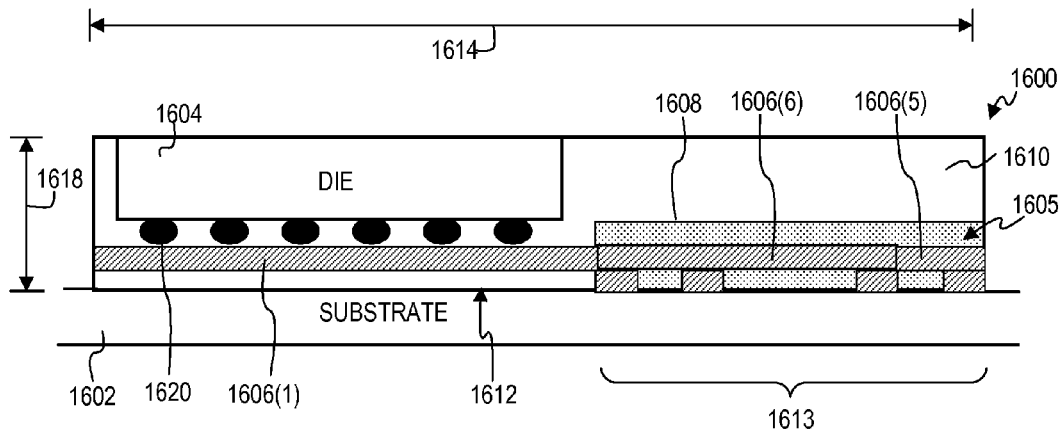
FIG. 16 shows a cross-sectional view of an integrated circuit disposed on a substrate, where the integrated circuit has a lead configuration adapted for coupled inductor applications, according to an embodiment.
Figure 17:
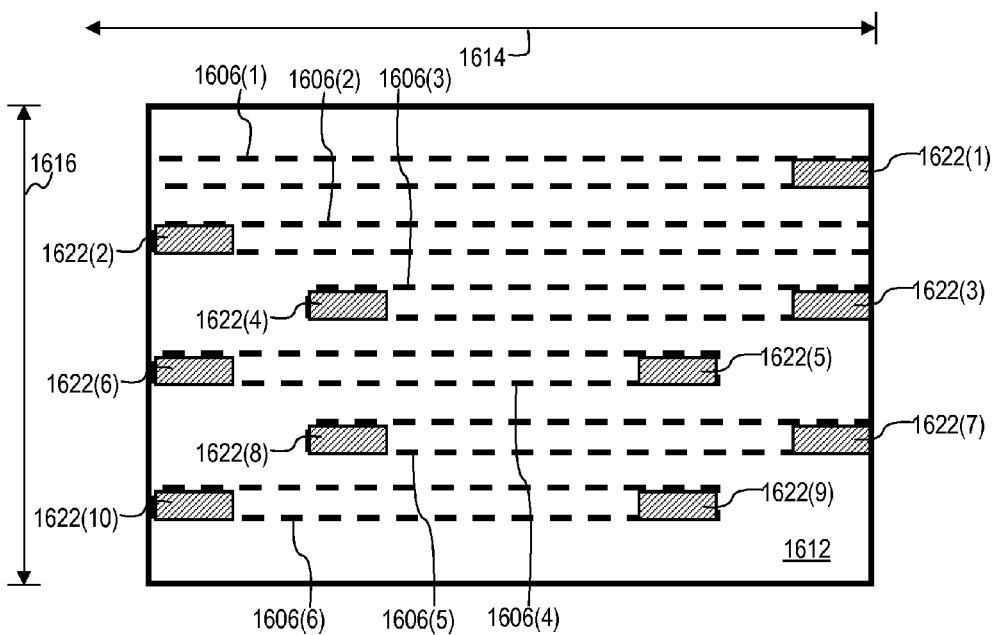
FIG. 17 shows a plan view of a portion of a bottom outer surface of the FIG. 16 integrated circuit.

FIG. 16 shows a cross-sectional view of an integrated circuit 1600 disposed on a substrate 1602. Integrated circuit 1600 includes a flip-chip semiconductor die 1604, a metallic lead frame 1605, a magnetic core 1608, and integrated circuit packaging material 1610. Integrated circuit packaging material 1610 encapsulates die 1604, magnetic core 1608, and a portion of lead frame 1605 to form a QFNL integrated circuit package including a bottom outer surface 1612 facing substrate 1602. In some embodiments, integrated circuit packaging material 1610 includes a polymer material molded around die 1604, lead frame 1605, and magnetic core 1608 by an injection molding process. FIG. 17 shows a plan view of a portion 1613 of bottom outer surface 1612 under magnetic core 1608, where portions of lead frame 1605 that are not visible in the plan view are denoted by dashed lines. Integrated circuit 1600 has a length 1614, a width 1616, and a height 1618, as shown.

Figure 18:
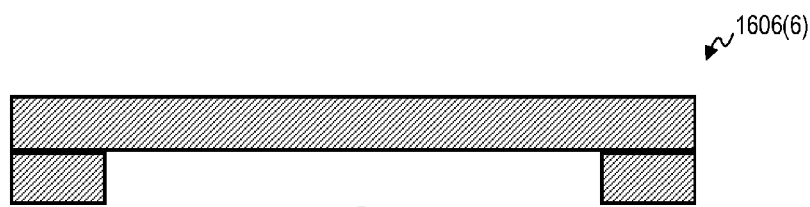
FIG. 18 shows a side elevational view of a lead of the FIG. 16 integrated circuit.

Die 1604 is electrically coupled to lead frame 1605 via solder balls 1620. Die 1604 is disposed beside magnetic core 1608 along length 1614, and the die and core are disposed over different respective portions of bottom outer surface 1612. Lead frame 1605 includes metallic leads 1606 which are each wound around a portion of magnetic core 1608 in the lengthwise 1614 direction, such that leads 1606 are wound through core 1608 in the lengthwise direction. Leads 1606 are separated or offset from each other in the widthwise 1616 direction. One end of each lead 1606(1), 1606(2) is electrically coupled to die 1604, while the other end of each lead forms a respective solder tab 1622(1), 1622(2) on bottom outer surface 1612. Leads 1606(3)-1606(6), on the other hand, have a staple shape, with opposing ends forming respective solder tabs 1622 on bottom outer surface 1612. Solder tabs 1622 are terminals adapted for surface mount soldering to substrate 1602, to provide an electrical interface to integrated circuit 1600. FIG. 18 shows an elevational view of lead 1606(6). Each of leads 1606(3)-1606(5) has a shape substantially similar to that of lead 1606(6). Leads 1606(3)-1606(6) are electrically isolated from each other, as well as from die 1604, within integrated circuit 1600.

Figure 19:
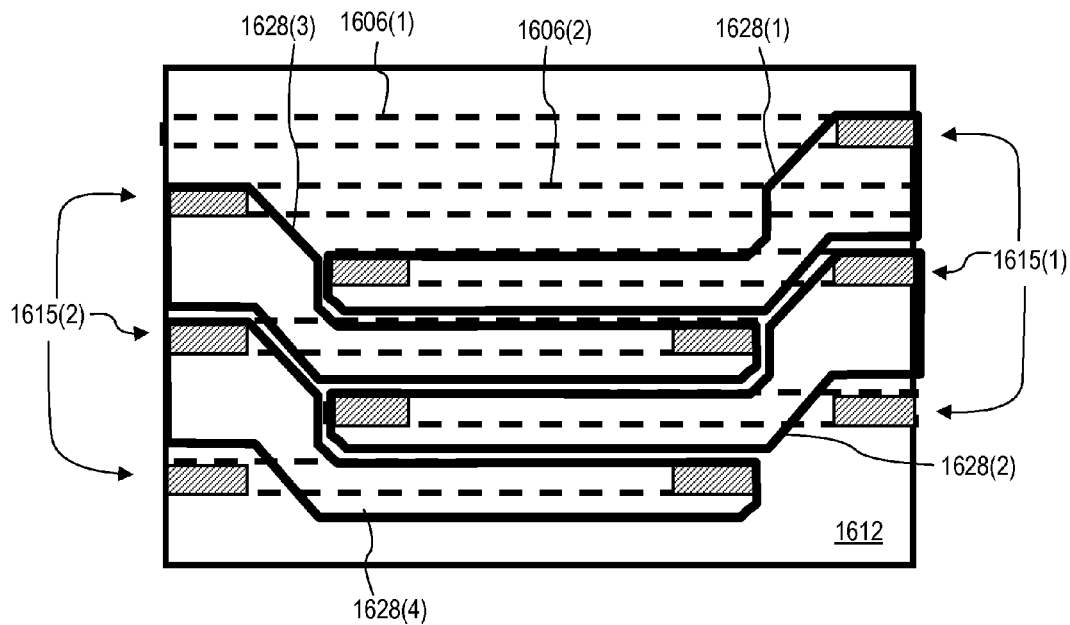
FIG. 19 illustrates one possible manner in which external conductors may be used to connect leads of the FIG. 16 integrated circuit to form a coupled inductor.

FIG. 19 illustrates one possible manner in which leads 1606 may be connected by external conductors to form a coupled inductor. Specifically, FIG. 19 illustrates bottom outer surface 1612 with outlines of external conductors 1628 electrically coupling leads 1606 to form first and second windings 1615(1), 1615(2), respectively. Conductors 1628 are typically conductive traces of substrate 1602. Conductors 1628(1), 1628(2) electrically couple leads 1606(1), 1606(3), 1606(5) in series to form first winding 1615(1) having three winding turns, where each lead 1606(1), 1606(3), 1606(5) forms one respective turn of the winding. Conductors 1628(3), 1628(4) electrically couple leads 1606(2), 1606(4), 1606(6) in series to form second winding 1615(2) having three winding turns, where each lead 1606(2), 1606(4), 1606(6) forms one respective turn of the winding. Thus, magnetic core 1608, leads 1606, and external conductors 1628 collectively form a coupled inductor including two windings 1615(1), 1615(2), in the FIG. 19 configuration.

The configuration of integrated circuit 1600 promotes both strong magnetic coupling of windings 1615(1), 1615(2) and the ability to achieve desired leakage inductance values, in coupled inductor applications. Magnetic coupling of windings 1615(1), 1615(2) is associated with magnetic flux generated by current flowing through one of windings 1615(1), 1615(2) linking the other winding. Thus, strong magnetic coupling of windings 1615(1), 1615(2) is achieved from a low reluctance magnetic flux path linking the windings. Leakage inductance of winding 1615(1), in contrast, is associated with magnetic flux generated by current flowing through winding 1615(1) that does not link winding 1615(2). Similarly, leakage inductance of winding 1615(2) is associated with magnetic flux generated by current flowing through winding 1615(2) that does not link winding 1615(1). Thus, leakage inductance of a given winding 1615 is achieved from magnetic flux paths that are unique to the winding. Integrated circuit 1600's configuration helps achieve both strong magnetic coupling and leakage inductance by providing both shared and unique magnetic flux paths, as discussed below with respect to FIG. 20, which is the same as FIG. 17, but with different annotations.

Figure 20:
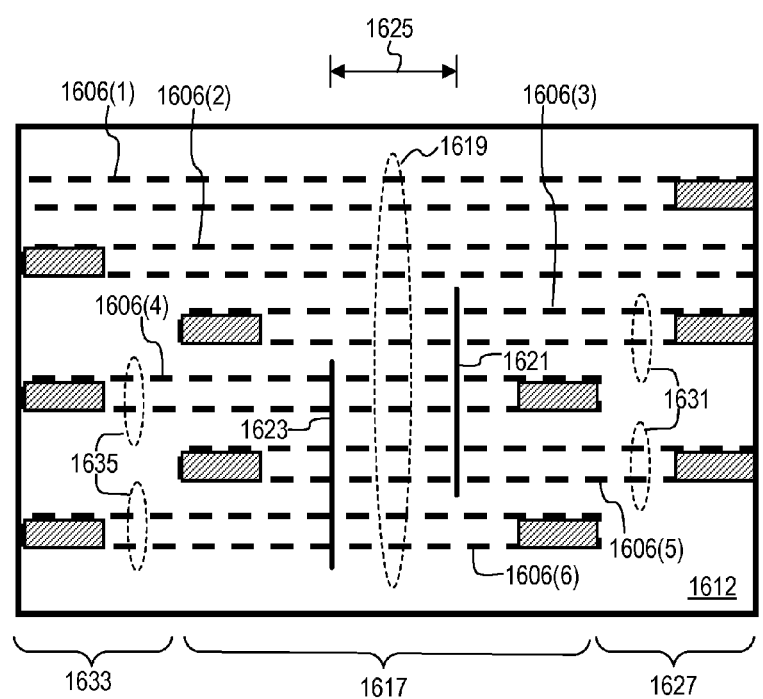
FIG. 20 shows a plan view like that of FIG. 17, but with different annotations to illustrate magnetic flux paths.

Significant portions of windings 1615(1), 1615(2) overlap along length 1614, thereby providing a low reluctance magnetic flux path linking both windings, resulting in strong magnetic coupling of the windings. In particular, leads 1606(1), 1606(2), which form a part of first and second windings 1615(1), 1615(2), respectively, completely overlap along length 1614. Additionally, leads 1606(3), 1605(5), which form part of first winding 1615(1), overlap with leads 1606(4), 1606(6), which form part of second winding 1615(2), along length portion 1617, as shown in FIG. 20. Magnetic flux traveling through this shared path links both windings 1615(1), 1615(2) and is symbolically shown by dashed lines 1619 in FIG. 20.

Portions of leads 1606(3), 1606(5) are also offset from portions of leads 1606(4), 1606(6) along length 1614 to provide leakage magnetic flux paths. Leads 1606(3), 1606(5) are each wound around a center axis 1621, and leads 1606(4), 1606(6) are each wound around a center axis 1623. Axes 1621, 1623 are offset by distance 1625 in the lengthwise 1614 direction, such that portions of winding 1615(1) are offset from portions of winding 1615(2) along length 1614. In particular, portions 1627 of leads 1606(3), 1606(5) do not overlap with leads 1606(4), 1606(6) along length 1614, thereby providing leakage magnetic flux paths for first winding 1615(1). Leakage magnetic flux associated with first winding 1615(1) is symbolically shown by dashed lines 1631 in FIG. 20. On the other hand, portions 1633 of leads 1606(4), 1606(6) do not overlap with leads 1606(3), 1606(5) along length 1614, thereby providing leakage magnetic flux paths for second winding 1615(2). Leakage magnetic flux associated with second winding 1615(2) is symbolically shown by dashed line 1635 in FIG. 20.

Magnetic coupling can be adjusted during the design of integrated circuit 1600, for example, by varying the configuration of overlapping or common portion 1617. For example, magnetic coupling can be increased by increasing the size of overlapping portion 1617. Similarly, leakage inductance can be adjusted during the design of integrated circuit 1600 by varying the configuration of non-overlapping portions of 1627, and/or 1633. For example, leakage inductance of winding 1615(1) can be decreased by decreasing the size of non-overlapping portion 1627. Although it is anticipated that non-overlapping portions 1627, 1633 will typically have essentially identical configurations (e.g., identical size and magnetic material composition) to achieve symmetrical leakage inductance values, non-overlapping portions 1627, 1633 could differ to achieve non-symmetrical leakage inductance values, if required. As discussed, for example, in U.S. Patent Application Publication Number 2011/0169476 to Ikriannikov et al., which is incorporated herein by reference, non-symmetrical leakage inductance values may be advantageous in certain applications.

Figure 21:
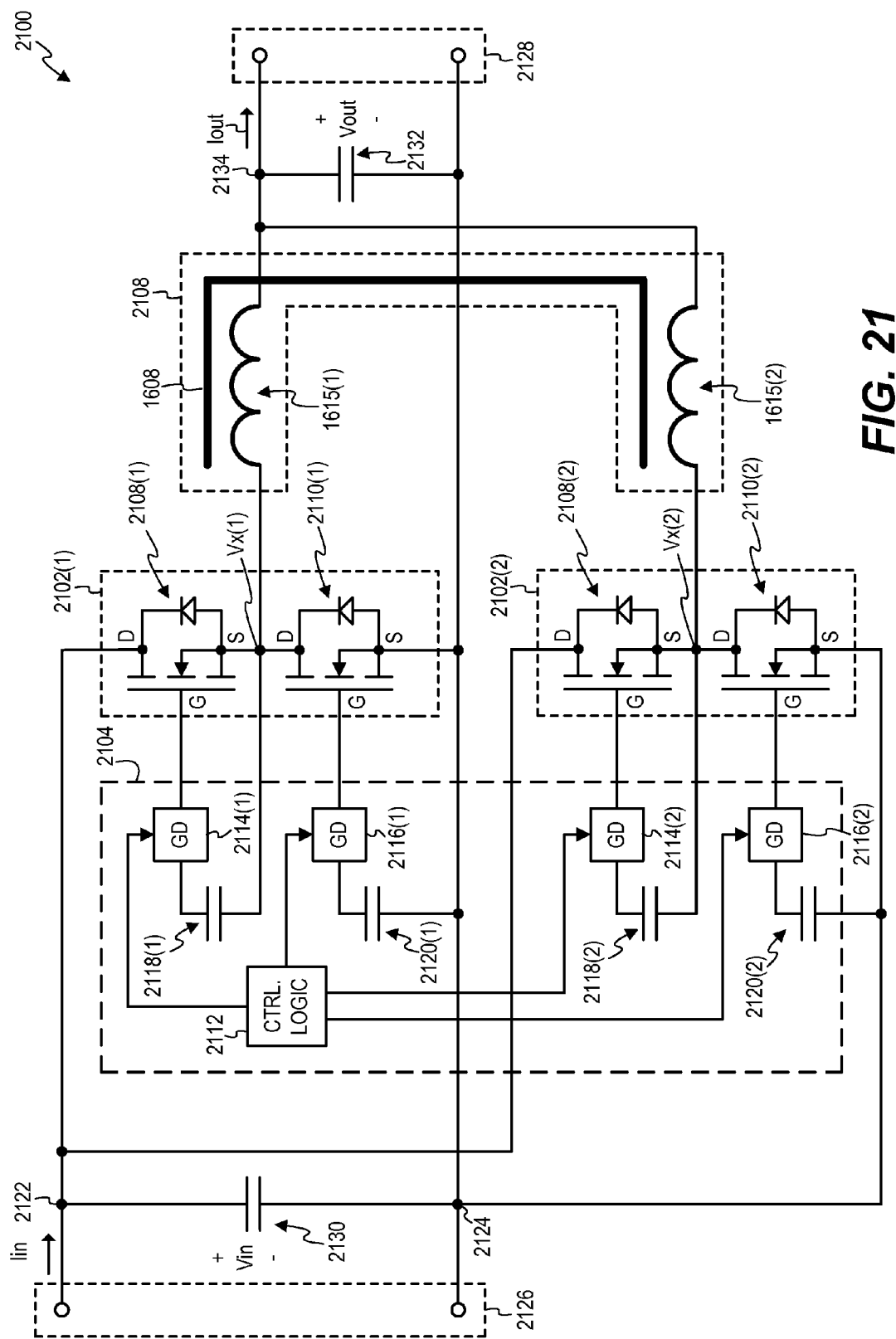
FIG. 21 shows a schematic of a multi-phase buck DC-to-DC switching power converter at least partially formed by some embodiments of the FIG. 16 integrated circuit.

Integrated circuit 1600 forms at least part of a switching power converter. For example, FIG. 21 shows a schematic of a multi-phase buck DC-to-DC switching power converter 2100, which is at least partially formed by certain embodiments of integrated circuit 1600 with leads 1606 connected according to FIG. 19. In these embodiments, die 1604 includes two switching circuits 2102 and a controller 2104. First winding 1615(1) is electrically coupled between a switching node Vx(1) of switching circuit 2102(1) and an output power rail 2134. Winding 1615(2) is electrically coupled between a switching node Vx(2) of switching circuit 2102(2) and output power rail 2134. Windings 1615(1), 1615(2) and magnetic core 1608 collectively form a coupled inductor 2108. Each switching circuit 2102 includes a control transistor 2108 and a freewheeling transistor 2110 electrically coupled in series between input power rail 2122 and reference power rail 2124. Transistors 2108, 2110 are joined at a switching node Vx. Although transistors 2108, 2110 are an n-channel, enhancement mode MOSFETs in this embodiment, transistors 2108, 2110 could alternately be other types of transistors, or even switching devices other than transistors.

Converter 2100 includes two parallel connected power stages or "phases." The first power stage or phase includes switching circuit 2102(1) and an inductor including winding 1615(1) and magnetic core 1608. The second power stage or phase includes switching circuit 2102(2) and an inductor including winding 1615(2) and magnetic core 1608. Thus, both phases share coupled inductor 2108. Controller 2104 includes control logic 2112, respective first driver circuitry 2114 for each control transistor 2108, and respective second driver circuitry 2116 for each freewheeling transistor 2110. Each first driver circuitry 2114 instance drives a gate-to-source voltage of its respective control transistor 2108 between two different voltage rails, to cause the transistor to switch between its conductive and non-conductive states. Similarly, each second driver circuitry 2116 instance drives a gate-to-source voltage of its respective freewheeling transistor 2110 between two different voltage rails, to cause the transistor to switch between its conductive and non-conductive states. Controller 2104 further includes a respective first driver capacitor 2118 electrically coupled to each first driver circuitry 2114 instance, and a respective second driver capacitor 2120 electrically coupled to each second driver circuitry 2116 instance. Each first capacitor 2118 supplies the high frequency current associated with charging and discharging the gate of its respective control transistor 2108, and each second capacitor 2120 supplies the high frequency current associated with charging and discharging the gate of its respective freewheeling transistor 2110. Capacitors 2118, 2120 should be located near their respective driver circuitry 2114, 2116 for reasons similar to those discussed above with respect to FIG. 4.

In alternate embodiments where control and freewheeling transistors 2108, 2110 are replaced with other types of transistors, first and second driver circuitry 2114, 2116 are modified, as appropriate, to provide the necessary signals to cause the transistors to switch between their conductive and non-conductive states. For example, in certain alternate embodiments, control and freewheeling transistors 2108, 2110 are replaced with bipolar junction transistors, and first and second driver circuitry 2114, 2116 are modified to generate the necessary base current signals to cause the bipolar junction transistors to switch between their conductive and non-conductive states.

Control logic 2112 controls operation of driver circuitry 2114, 2116 of each phase such that the switching circuit 2102 of the phase repeatedly switches switching node Vx between at least input power rail 2122 and reference power rail 2124, typically at a frequency of 100 kHz or greater. The switching action causes current through the phase's inductor to repeatedly ramp up and down, thereby transferring power between converter input port 2126 and output port 2128. Control logic 2112 is optionally adapted to control switching circuits 2102 such that they switch out-of-phase with respect to each other, to achieve ripple current cancellation. In some embodiments, control logic 2112 is adapted to control switching circuit 2102 operation to regulate one or more converter parameters, such as input voltage Vin, input current Iin, input power, output voltage Vout, output current Iout, and/or output power.

Switching power converter 2100 typically further includes an input capacitor 2130 electrically coupled between input power rail 2122 and reference power rail 2124. Although not required, input capacitor 2130 is typically located within integrated circuit 1600 near switching circuits 2102, to minimize impedance in the path between input capacitor 2130 and the switching circuits. Excessive impedance in this path may cause slow current commutation, thereby resulting in high switching losses. Excessive impedance in this path may also cause excessive parasitic ringing, potentially resulting in electromagnetic compatibility issues and/or control difficulties. Converter 2100 also optionally includes an output capacitor 2132 electrically coupled between output power rail 2134 and reference power rail 2124. Output capacitor 2132 absorbs ripple current generated by switching circuit 2102 operation, and the capacitor may also supply high frequency components of output current Iout. Capacitor 2132 is optionally omitted in applications where a load (not shown) electrically coupled to output port 2128 includes sufficient capacitance to filter ripple current and to supply high frequency load current.

Freewheeling transistors 2110 are optionally replaced with freewheeling diodes to reduce complexity, with the possible tradeoff of reduced efficiency. In some alternate embodiments, switching power converter 2100 has a topology other than a multi-phase buck DC-to-DC converter topology. For example, in certain alternate embodiments, switching power converter 2100 has a multi-phase boost DC-to-DC converter topology, and in certain other alternate embodiments, switching power converter 2100 has a multi-phase buck-boost DC-to-DC converter topology. Additionally, integrated circuit 1600 may include additional circuitry, and/or possess additional functionality, without departing from the scope hereof. For example, in some embodiments, die 1604 further includes telemetry circuitry, which enables integrated circuit 1600 to communicate with external systems.

Although lead frame 1605 is shown as including six leads 1606, it could include a different number of leads 1606 without departing from the scope hereof. For example, some alternate embodiments including nine leads 1606, thereby enabling a three-winding coupled inductor to be formed, where each winding has three turns. In these alternate embodiments, the integrated circuit forms a three phase switching power converter, for example. Thus, switching power converter 2100 could be modified to have additional power stages or phases. It should also be understood that lead frame 1605 will typically include leads in addition to leads 1606, such as to provide electrical interface to additional nodes of integrated circuit 1600. These additional leads are not shown, though, to promote illustrative clarity. For example, in applications where integrated circuit 1600 forms DC-to-DC switching power converter 2100 (FIG. 21), integrated circuit 1600 typically includes additional leads and solder tabs to provide electrical interface to input power rail 2122, reference power rail 2124, and various control nodes of controller 2104. Furthermore, the placement of die 1604 in integrated circuit 1600 could be varied. For example, in some alternate embodiments, die 1604 is stacked over magnetic core 1608, instead of being disposed beside magnetic core 1608.

Figure 22:
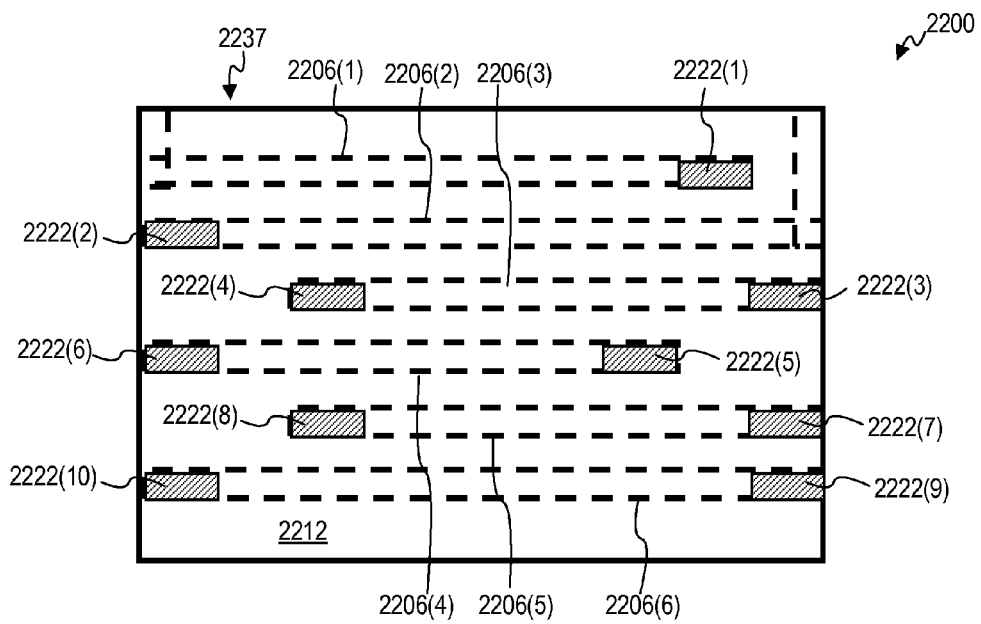
FIG. 22 shows a plan view of a portion of a bottom outer surface of an integrated circuit like that of FIG. 16, but with a different lead configuration, according to an embodiment.

FIG. 22 shows a plan view of a portion of a bottom outer surface 2212 of an integrated circuit 2200. Integrated circuit 2200 is like integrated circuit 1600 of FIG. 16, but has slightly different lead configuration, in that both leads 2206 (1), 2206(2) originate on a common side 2237 of integrated circuit 2200, which may facilitate connecting these leads to the integrated circuit's semiconductor die. One end of each lead 2206(1), 2206(2) forms a respective solder tab 2222, and both ends of each lead 2206(3)-2206(6) form respective solder tabs 2222. Solder tabs 2222 are terminals disposed on bottom outer surface 2212 and adapted for surface mounting soldering to a substrate, to provide electrical interface to integrated circuit 2200.

Figure 23:
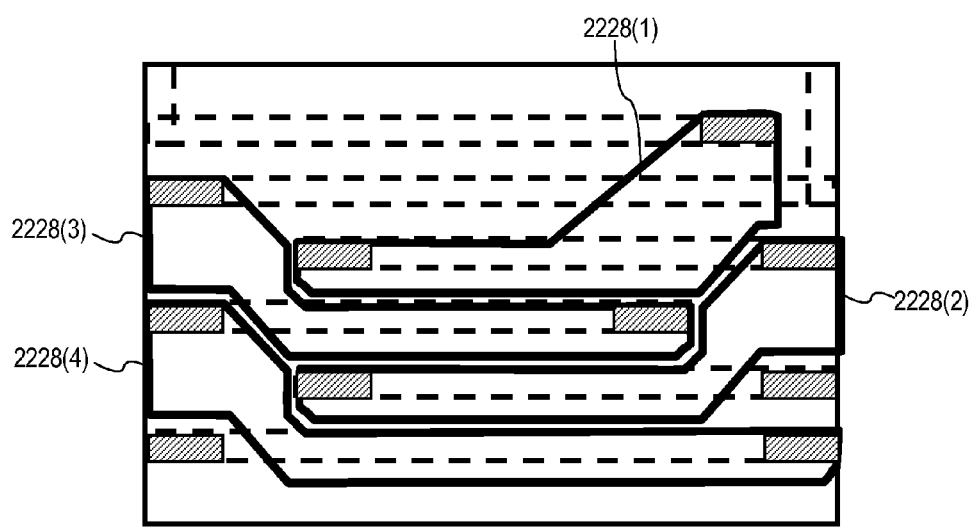
FIG. 23 illustrates one possible manner in which external conductors may be used to connect the leads of the FIG. 22 integrated circuit to form a two-winding coupled inductor.

FIG. 23 illustrates one possible manner in which external conductors 2228 may be used to connect leads 2206 to form a two-winding coupled inductor, where each winding has two turns. External conductors 2228 are, for example, conductive traces. The first turn includes leads 2206(1), 2206(3), 2206(5) electrically coupled in series by conductors 2228(1), 2228(2), and the second turn includes leads 2206(2), 2206(4), 2206(6) electrically coupled in series by conductors 2228(3), 2228(4).

Figure 24:
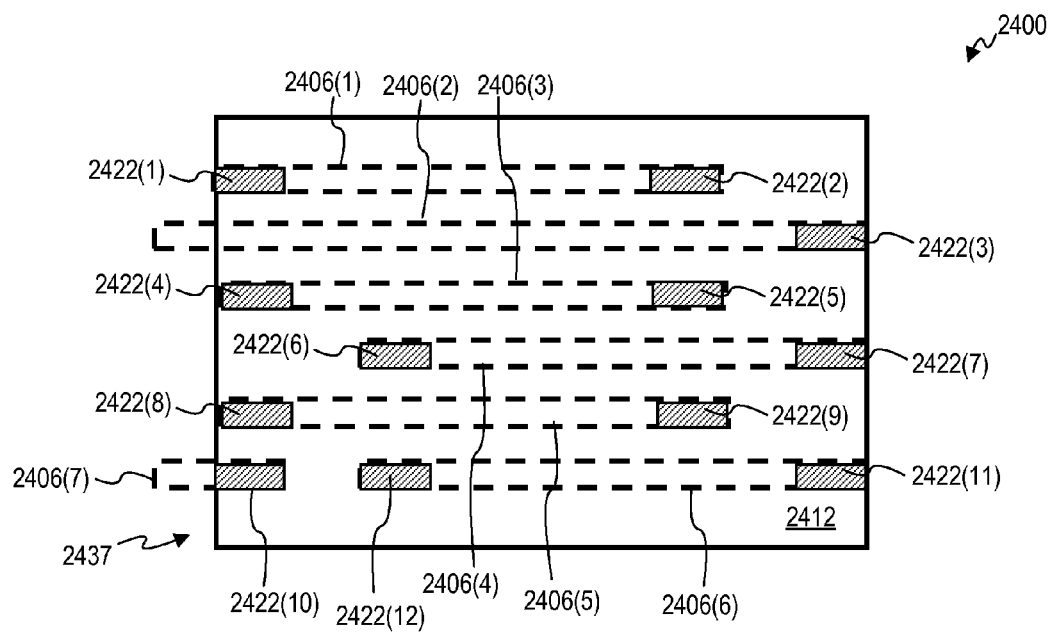
FIG. 24 shows a plan view of a portion of a bottom outer surface of another integrated circuit similar to that of FIG. 16, but with a different lead configuration, according to an embodiment.

FIG. 24 shows a plan view of a portion of a bottom outer surface 2412 of an integrated circuit 2400. Integrated circuit 2400 is similar to integrated circuit 1600 of FIG. 16, but has a different lead configuration. Both of leads 2406(2), 2406(7) originate on a common side 2437 of integrated circuit 2400, which may facilitate connecting the leads to the integrated circuit's semiconductor die. One end of each lead 2406(2), 2406(7) forms a respective solder tab 2422, and both ends of each lead 2406(1) and 2406(3)-2206(6) form a respective solder tab 2422. Solder tabs 2422 are terminals disposed on bottom outer surface 2412 and are adapted for surface mount soldering to a substrate, to provide an electrical interface to integrated circuit 2400.

Figure 25:
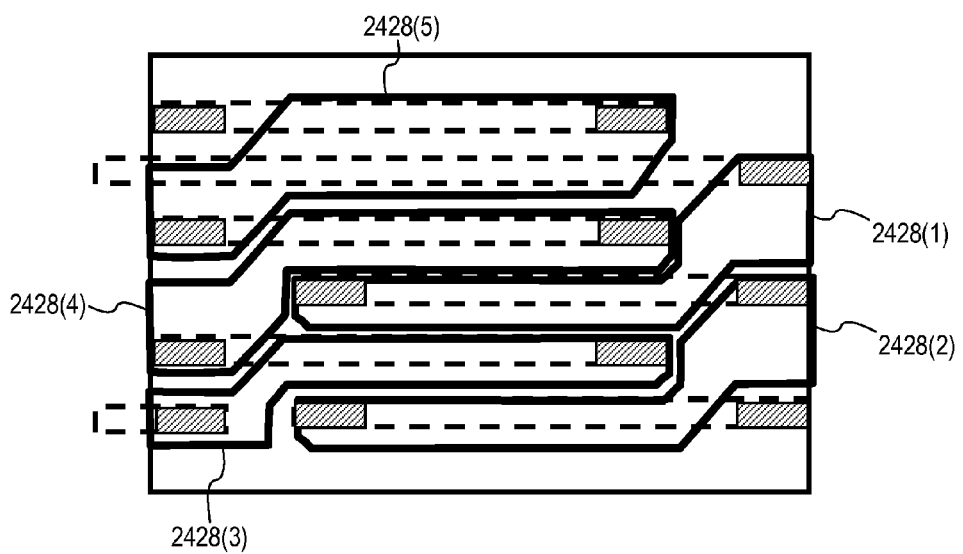
FIG. 25 illustrates one possible manner in which external conductors may be used to connect the leads of the FIG. 24 integrated circuit to form a two-winding coupled inductor.

FIG. 25 illustrates one possible manner in which external conductors 2428 may be used to connect leads 2406 to form a two-winding coupled inductor, where each winding has three turns. External conductors 2428 are, for example, conductive traces. The first turn includes leads 2406(2), 2406(4), and 2406(6) electrically coupled in series by conductors 2428(1), 2428(2), and the second turn includes leads 2406(1), 2406(3), 2406(5), and 2406(7) electrically coupled in series by conductors 2428(3)-2428(5).

Integrated circuits 1600, 2200, and 2400 each include leads offset from each other in the lengthwise direction to provide leakage magnetic flux paths, as discussed above. However, leakage magnetic flux paths can additionally or alternately be obtained by separating windings in the magnetic core.

Figure 26:
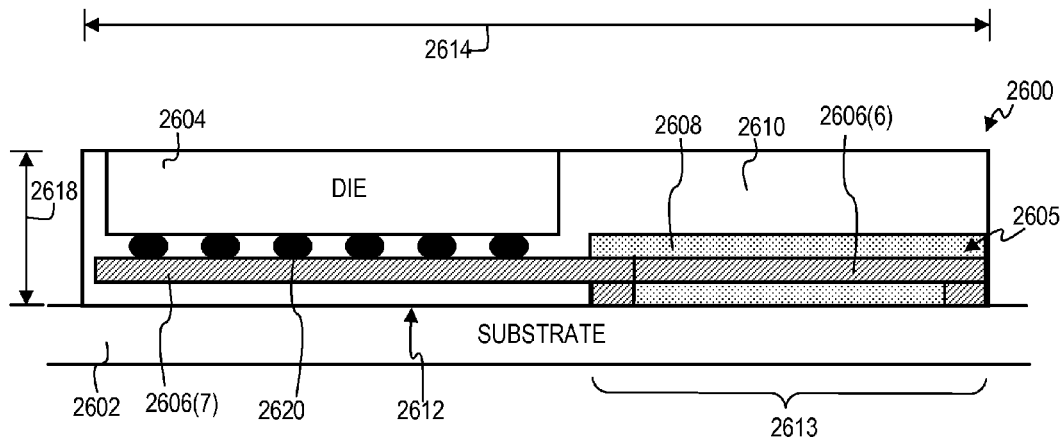
FIG. 26 shows a cross-sectional view of another integrated circuit disposed on a substrate, where the integrated circuit has a lead configuration adapted for coupled inductor applications, according to an embodiment.
Figure 27:
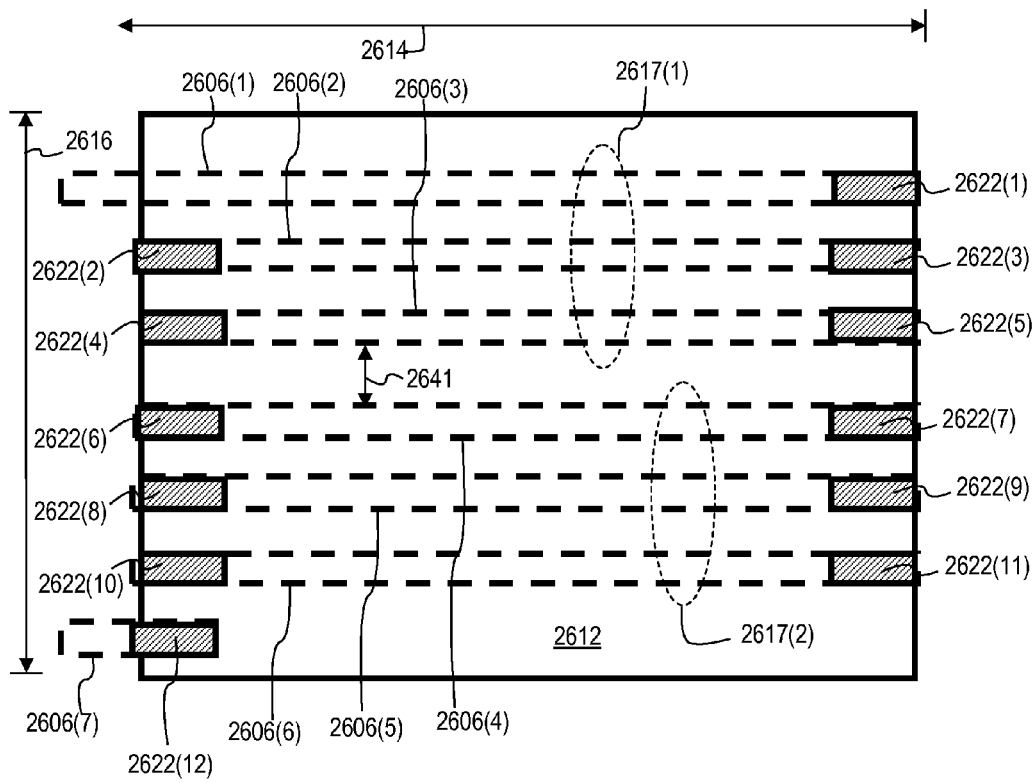
FIG. 27 shows a plan view of a portion of a bottom outer surface of the FIG. 26 integrated circuit.

For instance, FIG. 26 shows a cross-sectional view of an integrated circuit 2600 disposed on a substrate 2602. Integrated circuit 2600 includes a flip-chip semiconductor die 2604, a metallic lead frame 2605, a magnetic core 2608, and integrated circuit packaging material 2610. Integrated circuit packaging material 2610 encapsulates die 2604, magnetic core 2608, and a portion of lead frame 2605 to form a QFNL integrated circuit package including a bottom outer surface 2612 facing substrate 2602. In some embodiments, integrated circuit packaging material 2610 includes a polymer material molded around die 2604, lead frame 2605, and magnetic core 2608 by an injection molding process. FIG. 27 shows a plan view of a portion 2613 of bottom outer surface 2612, under magnetic core 2608, where portions of lead frame 2605 that are not visible are denoted by dashed lines. Integrated circuit 2600 has a length 2614, a width 2616, and a height 2618, as shown.

Die 2604 is electrically coupled to lead frame 2605 via solder balls 2620. Die 2604 is disposed beside magnetic core 2608, such that die 2604 and magnetic core 2608 are separated along length 2614, and such that the die and core are disposed over different respective portions of bottom outer surface 2612. Lead frame 2605 includes metallic leads 2606 wound around a portion of magnetic core 2608 in the lengthwise 2614 direction, such that leads 2606 are wound through core 2608 in the lengthwise direction. One end of each lead 2606(1), 2606(7) is electrically coupled to die 2604, while the other end of each of these leads forms a respective solder tab 2622 on bottom outer surface 2612. Both ends of each lead 2606(2)-2606(6) form respective solder tabs 2622 on bottom outer surface 2612. Solder tabs 2622 are terminals adapted for surface mount soldering to substrate 2602, to provide an electrical interface to integrated circuit 2600. Leads 2606(2)-2606(6) are electrically isolated from each other, as well as from die 2604, in integrated circuit 2600.

Leads 2606 may be grouped into two lead sets 2617(1), 2617(2), and the leads of each set may be electrically coupled in series to form two windings, as discussed below. First lead set 2617(1) includes leads 2606(1)-2606(3), and second lead set 2617(2) includes leads 2606(4)-2606(6). Lead sets 2617(1) and 2617(2) do not overlap along width 2616, and the lead sets are separated along the width by a separation distance 2641.

Figure 28:
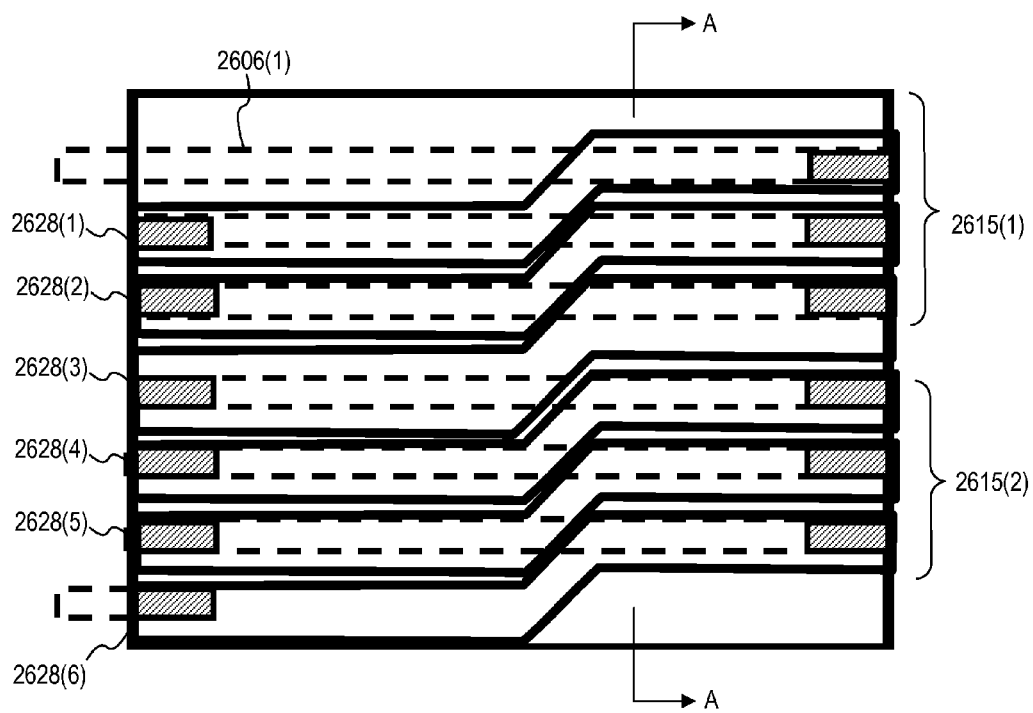
FIG. 28 illustrates one possible manner in which external conductors may be used to connect leads of the FIG. 26 integrated circuit to form a coupled inductor.

FIG. 28 illustrates one possible manner in which external conductors may be used to electrically couple leads of each set 2617 to form a two winding coupled inductor. FIG. 28 shows bottom outer surface 2612 with the outlines of external conductors 2628 electrically coupling leads 2606. External conductors 2628 are, for example, conductive traces of substrate 2602. Conductors 2628(1), 2628(2) electrically couple in series the leads of first lead set 2617(1) to form a first winding 2615(1), and conductors 2628(4), 2628(5) electrically couple in series the leads of second lead set 2617(2) to form a second winding 2615(2). Each winding 2615 has three turns, where each winding-turn is formed by a respective lead 2606. Conductor 2628(6) provides an electrical interface from lead 2606(7) to second winding 2615(2), but this lead and conductor do not form a material portion of the winding. Conductor 2628(3) is optionally included, as shown, to couple windings 2615 in parallel, such as in applications where the windings are coupled to a common node. The inductor and die 2604 collectively form a switching power converter, such as a converter similar to that discussed above with respect to FIG. 21.

Figure 29:
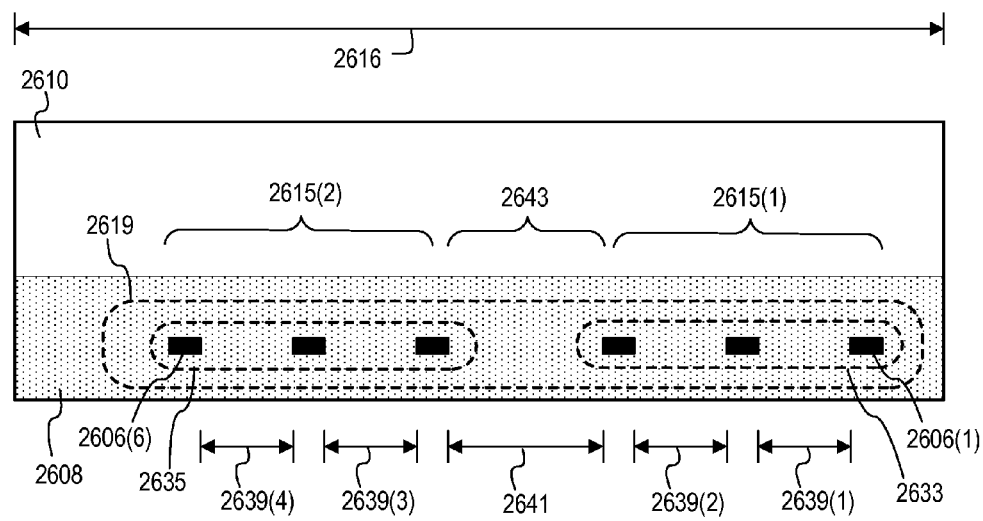
FIG. 29 shows a cross-sectional view of the FIG. 26 integrated circuit taken along line A-A of FIG. 28.

FIG. 29 shows a cross-sectional view of integrated circuit 2600 taken along line A-A of FIG. 28. Leads 2606 are separated from each other in the widthwise 2616 direction, and adjacent leads 2606 within each lead set 2617 (or within each winding 2615) are separated by a respective separation distance 2639 in the widthwise 2616 direction, to prevent the leads from shorting. Lead sets 2617(1), 2617(2) (or windings 2615(1), 2615(2)) are also separated from each other by separation distance 2641 to provide a path for leakage magnetic flux. Leakage magnetic flux associated with first winding 2615(1) is symbolically shown by dashed lines 2633, and leakage magnetic flux associated with second winding 2615(2) is symbolically shown by dashed lines 2635. Magnetic flux coupling both windings 2615 is symbolically shown by dashed lines 2619. As shown, leakage magnetic flux 2633, 2635 flows through magnetic core 2608 portion 2643 between windings 2615(1), 2615(2), while coupling magnetic flux 2619 does not flow between the windings. Accordingly, leakage inductance of each winding 2615(1), 2615(2) increases with separation distance 2641, and leakage inductance can be tuned during the design process by tuning separation distance 2641. Although not required, separation distance 2641 will typically be greater than each separation distance 2639, since separation distance 2641 must be sufficiently large to achieve significant leakage inductance, and separation distances 2639 need only be large enough to prevent shorting of leads 2606. While lead separation distances 2639 are typically uniform to achieve symmetrical magnetic characteristics, separation distances 2639 could vary without departing from the scope hereof.

Although lead frame 2605 is shown as including seven leads 2606, it could have a different number of leads 2606 without departing from the scope hereof. For example, some alternate embodiments including ten leads 2606, thereby enabling a three-winding coupled inductor to be formed, which each winding has three turns. In these alternate embodiments, the integrated circuit forms a three phase switching power converter, for example. Lead frame 2605 will also typically include leads in addition to leads 2606, such as to provide electrical interface to additional nodes of integrated circuit 1600. These additional leads are not shown, though, to promote illustrative clarity. For example, in applications where integrated circuit 2600 forms a DC-to-DC switching power converter similar to that of FIG. 21, integrated circuit 2600 typically includes additional leads and solder tabs to provide electrical access to an input power rail, a reference power rail, and various control nodes of die 2604. Furthermore, the placement of die 2604 in integrated circuit 2600 could be varied. For example, in some alternate embodiments, die 2604 is stacked on magnetic core 2608, instead of disposed beside magnetic core 2608.

Figure 30:
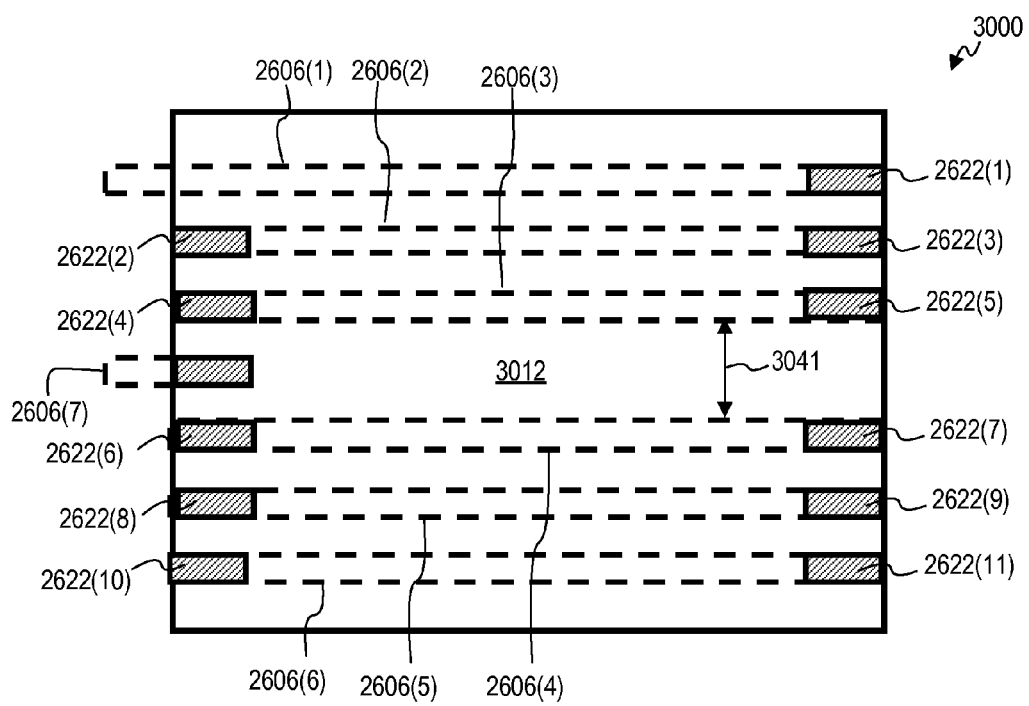
FIG. 30 shows a plan view of a portion of a bottom outer surface of an integrated circuit like that of FIG. 26, but with a different lead configuration, according to an embodiment.
Figure 31:
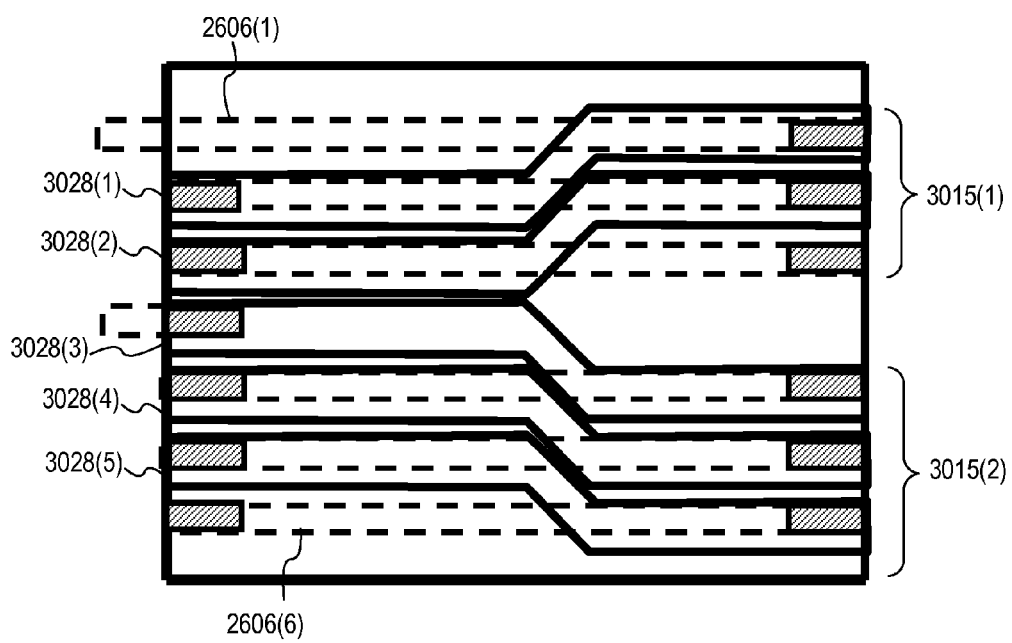
FIG. 31 illustrates one possible manner in which external conductors may be used to connect the leads of the FIG. 30 integrated circuit to form a two-winding coupled inductor.

FIG. 30 shows a plan view of a portion of a bottom outer surface 3012 of an integrated circuit 3000. Integrated circuit 3000 is like integrated circuit 2600 of FIG. 26, but with lead 2606(7) disposed in a different location. FIG. 31 illustrates one possible manner in which external conductors 3028 which are, for example, conductive traces, may be used to connect leads 2606 to form a two-winding coupled inductor, where each winding has two turns. The first turn 3015(1) includes leads 2606(1)-2606(3) electrically coupled in series by external conductors 3028(1) and 3028(2), and the second turn 3015(2) includes leads 2606(4)-2606(6) electrically coupled in series by external conductors 3028(4) and 3028 (5). Conductor 3028(3) provides electrical interface to second winding 3015(2). Leakage inductance is adjusted during integrated circuit design, for example, by varying a separation distance 3041 between leads 2602(3), 2602(4), in a manner similar to that discussed above with respect to integrated circuit 2600.

Figure 32:
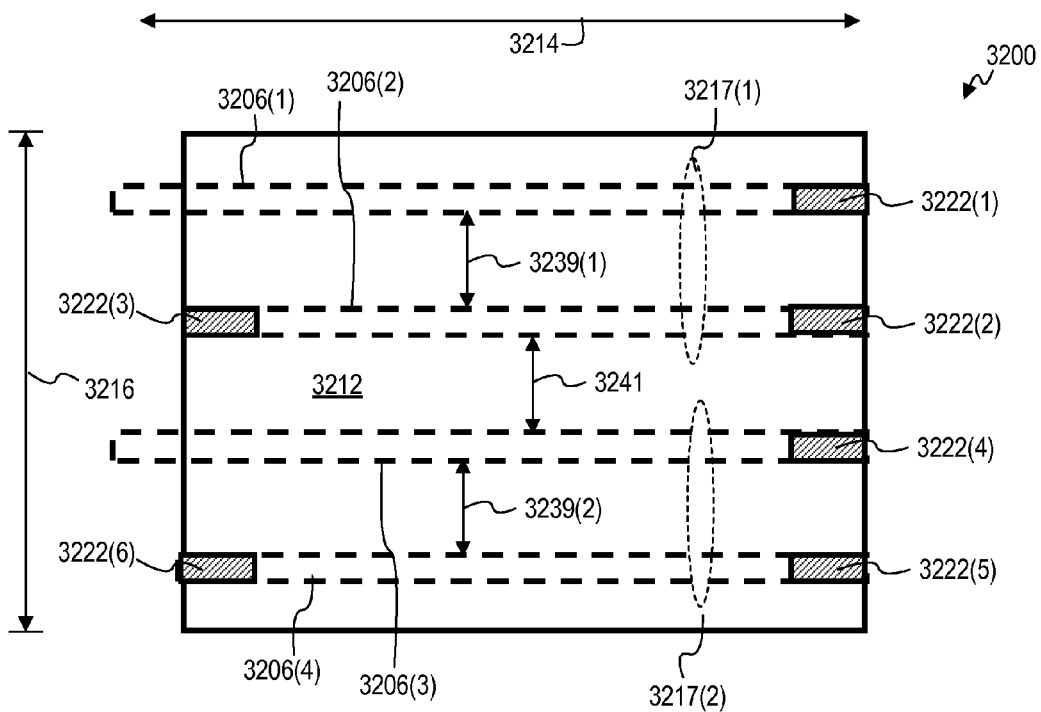
FIG. 32 shows a plan view of a portion of a bottom outer surface of an integrated circuit similar to that of FIG. 26, but with a different lead configuration and with different magnetic flux paths, according to an embodiment.

FIG. 32 shows a plan view of a portion of a bottom outer surface 3212 of an integrated circuit 3200. Integrated circuit 3200 is similar to integrated circuit 2600 of FIG. 26, but with fewer leads and different magnetic flux paths, as discussed below. Integrated circuit 3200 includes metallic leads 3206 (1)-3206(4), which are each wound around a portion of a magnetic core 3208 (not visible in FIG. 32), such that the leads are wound through core 3208 in the lengthwise 3214 direction. One end of each lead 3206(1), 3206(3) is electrically coupled to the semiconductor die of the integrated circuit, while the other end of each of these leads forms a respective solder tab 3222 on bottom outer surface 3212. Both ends of each lead 3206(2), 3206(4) form respective solder tabs 3222 on bottom outer surface 3212. Leads 3206(2), 3206(4) are electrically isolated from each other, as well as from the semiconductor die, in integrated circuit 3200. Solder tabs 3222 are terminals adapted for surface mount soldering to a substrate, to provide electrical interface to integrated circuit 3200. Integrated circuit 3200 has a width 3216, as shown.

Leads 3206 may be grouped into first and second lead sets 3217(1), 3217(2), which are non-overlapping along width 3216. First lead set 3217(1) includes leads 3206(1), 3206(2), and second lead set 3217(2) includes leads 3206(3), 3206(4). Lead sets 3217 are separated by a separation distance 3241, and leads 3206 within a lead set 3217 are separated by a respective separation distance 3239, along width 3216.

Figure 33:
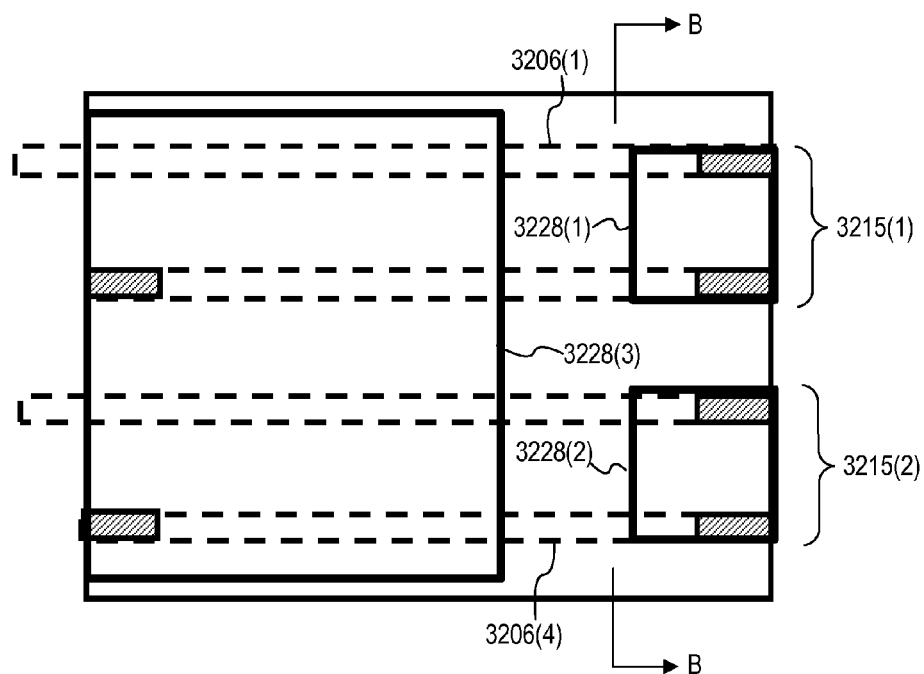
FIG. 33 illustrates one possible manner in which external conductors may be used to connect the leads of the FIG. 32 integrated circuit to form a two-winding coupled inductor.

FIG. 33 illustrates one possible manner in which external conductors 3228 may be used to connect leads 3206 within each lead set 3217 to form a two-winding coupled inductor, where each winding has one turn. External conductors 3228 are, for example, conductive traces. The first winding 3215 (1) includes leads 3206(1), 3206(2) electrically coupled in series by conductor 3228(1), and the second winding 3215 (2) includes conductors 3206(3), 3206(4) electrically coupled in series by conductor 3228(2). Conductors 3228 (1), 3228(2) are short and wide, thereby promoting low impedance connections. Connector 3228(3) is optionally included to electrically couple windings 3215(1), 3215(2) in parallel, such as in applications where the windings are electrically coupled to a common node.

Figure 34:
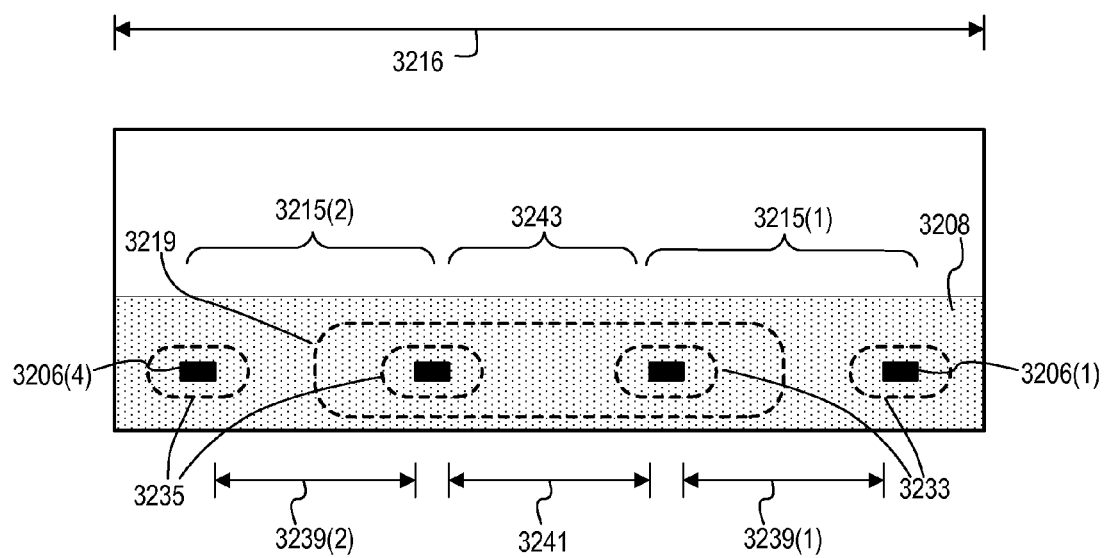
FIG. 34 shows a cross-sectional view of the FIG. 32 integrated circuit taken along line B-B of FIG. 33.

FIG. 34 is a cross-sectional view of integrated circuit 3200 taken along line B-B of FIG. 33. Dashed lines 3219 symbolically represent the path of coupling magnetic flux 3219 within magnetic core 3208. As shown, coupling magnetic flux 3219 flows through the winding turns, but not in core region 3243 between windings 3215. Accordingly, magnetic coupling of windings 3215 is adjusted during integrated circuit design, for example, by varying the configuration of the winding turns, such as by varying separation distances 3239. For instance, magnetic coupling of windings 3215 may be increased by increasing separation distances 3239, to provide a lower reluctance path for coupling magnetic flux 3219.

Dashed lines 3233 symbolically represent the path of leakage magnetic flux associated with first winding 3215(1), and dashed lines 3235 symbolically represent the path of leakage magnetic flux associated with second winding 3215 (2). Thus, leakage magnetic flux flows through core portion 3243 between windings 3215. Accordingly, leakage inductance may be adjusted, for example, by varying separation distance 3241 between lead sets 3217 (or between windings 3215). For example, leakage inductance may be decreased by decreasing separation distance 3241.

The integrated circuits discussed above may achieve one or more advantages over conventional integrated circuits including magnetic devices. For example, the fact that the integrated circuits discussed above use a lead frame for part or all of the inductor winding turns promotes small size by reducing, or eliminating, the need for dedicated winding components. In contrast, conventional integrated circuits with magnetic devices typically require several discrete components to form winding turns. Additionally, lead frames are typically relatively thick and therefore have relatively low impedance. Accordingly, use of a lead frame as a magnetic device winding promotes low winding losses. Discrete windings of conventional integrated circuits, on the other hand, may have a relatively high resistance, particularly in applications where winding size must be minimized due to packaging constraints.

As another example, in many of the embodiments disclosed herein, such as in integrated circuits 500, 900, 1000, 1200, 1400, 1600, 2200, 2400, 2600, 3000, and 3200, the winding turns are wound at least partially through the magnetic core, instead of being wound solely on the core's outer surface. In these configurations, the magnetic core at least partially shields the winding turns, thereby reducing or eliminating the potential for the winding turns to electrically short to adjacent components. Additionally, the magnetic core provides a complete path for magnetic flux loops, thereby helping minimize stray magnetic flux, since the magnetic core typically has a much larger magnetic permeability than material surrounding the core. Minimizing stray magnetic flux, in turn, promotes electromagnetic compatibility with external circuitry by reducing the potential for stray magnetic flux to negatively impact the external circuitry. Minimizing stray magnetic flux also promotes low losses by reducing the potential for external component heating from stray magnetic flux. Stray magnetic flux may cause eddy currents to circulate in nearby metallic components, thereby causing power loss and associated heating.

For example, consider again integrated circuit 2600 of FIGS. 26-29. Leads 2606 are wound through magnetic core 2608, such that magnetic core 2608 shields the winding turns formed of leads 2606. Additionally, magnetic core 2608 provides a complete path for coupling magnetic flux loops 2619, as well as for leakage flux loops 2633, 2635, as illustrated in FIG. 29. Accordingly, magnetic flux flows almost entirely within magnetic core 2608, thereby minimizing stray magnetic flux, since magnetic core 2608 typically has a much higher magnetic permeability than air and integrated circuit packaging material surrounding core.

Figure 46:
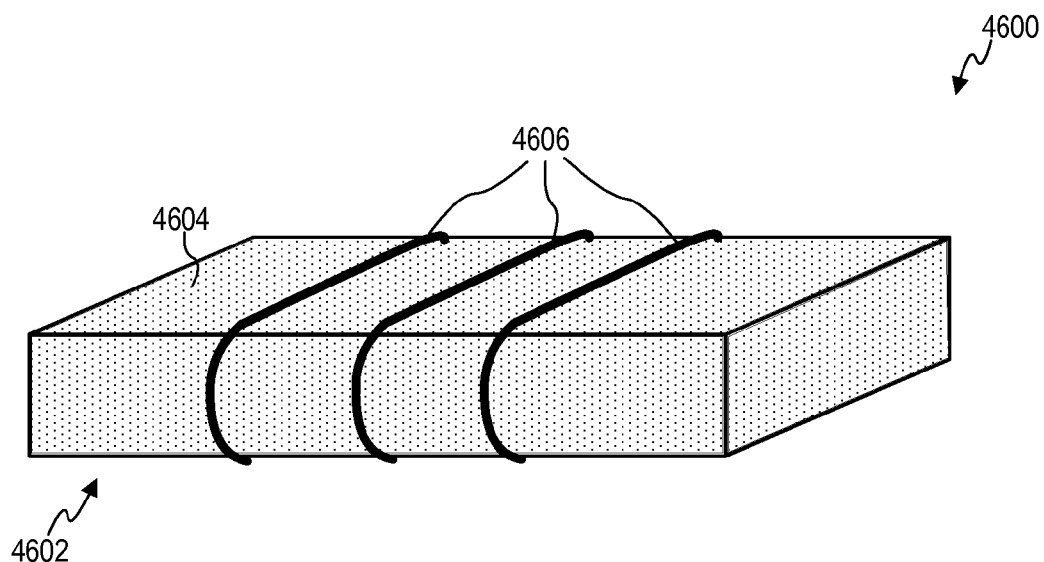
FIG. 46 shows a perspective view of a prior art inductor.
Figure 47:
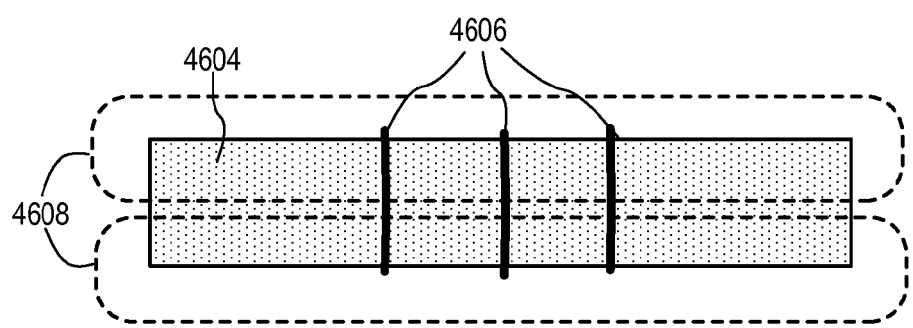
FIG. 47 shows a front elevational view of the FIG. 46 prior art inductor.

In contrast, consider prior art inductor 4600 shown in FIGS. 46 and 47. FIG. 46 is a perspective view, and FIG. 47 is an elevational view of front side 4602. Inductor 4600 includes a bar-shaped magnetic core 4604 and a winding 4606 wound around the core's outer surface. Winding 4606 is not shielded by magnetic core 4604, and the winding is therefore prone to short to external components. Additionally, magnetic core 4604 does not form a complete path for magnetic flux loops. Thus, magnetic flux, which is symbolically illustrated by dashed lines 4608 in FIG. 47, is not confined to core 4604, but instead flows around the top, bottom, left, and right sides of inductor 4600. The magnetic flux flowing outside of core 4604 may couple to nearby circuitry, thereby potentially causing electromagnetic interference. The flux outside of core 4604 may also induce eddy currents in nearby metallic components, causing losses and associated heating in the components.

Furthermore, in many embodiments of the integrated circuits disclosed herein, the magnetic core and the lead frame are disposed in a common portion of the integrated circuit package. Such sharing of integrated circuit package volume potentially enables use of a large magnetic core by allowing the core to extend into space that it is normally dedicated to lead frame components in conventional integrated circuits, thereby allowing the core to occupy a larger portion of the package volume than is generally feasible in conventional integrated circuits. Use of a large magnetic core, in turn, promotes high saturation current rating, low magnetic flux density, and large inductance value. Low magnetic flux density helps achieve efficient operation by minimizing magnetic core losses, which increase with increasing magnetic flux density. A large inductance value, in turn, promotes low ripple current magnitude, high efficiency, and/or ability to use a low switching frequency, in switching power converter applications.

Moreover, as discussed above, certain embodiments have lead configurations adapted for coupled inductor applications. These lead configurations advantageously enable leakage inductance, as well as winding magnetic coupling, to be tuned during integrated circuit design, thereby potentially enabling the coupled inductors to be optimized for their applications.

FIGS. 8, 11, 13, 15, 19, 23, 25, 28, 31, and 33 show examples of how leads may be electrically coupled using external conductors, such as substrate conductive traces, to form multi-turn and/or coupled inductors. Although use of external conductors to connect leads may offer significant flexibility and promote low cost, external conductors may also cause relatively large resistance losses, since conductive traces typically have a high resistance. Accordingly, certain embodiments of the integrated circuits disclosed herein use the circuit's lead frame, as opposed to external conductors, to connect leads along the integrated circuits bottom outer surface.

Consider, for example, integrated circuit 2600 of FIGS. 26-29. In an alternate embodiment, shown in FIG. 35 as integrated circuit 3500, leads 2606 are connected by a portion of a lead frame 3505, instead of by external conductors, on the circuit's bottom outer surface 3512. As shown, external conductors, such as connectors 2628 of FIG. 28, are replaced with lead frame portions 3528 connecting leads 3206 to form first and second windings 3215(1), 3215(2). Lead frame portions 3528 are typically significantly thicker than substrate conductive traces, and lead frame portions 3528 therefore typically have a significantly smaller resistance than conductive traces. Accordingly, the coupled inductor of integrated circuit 3500 will typically have a significantly smaller winding resistance than a coupled inductor of integrated circuit 2600 configured according to FIG. 28. The other integrated circuits disclosed herein could be modified in a manner similar to that of FIG. 35.

Figure 35:
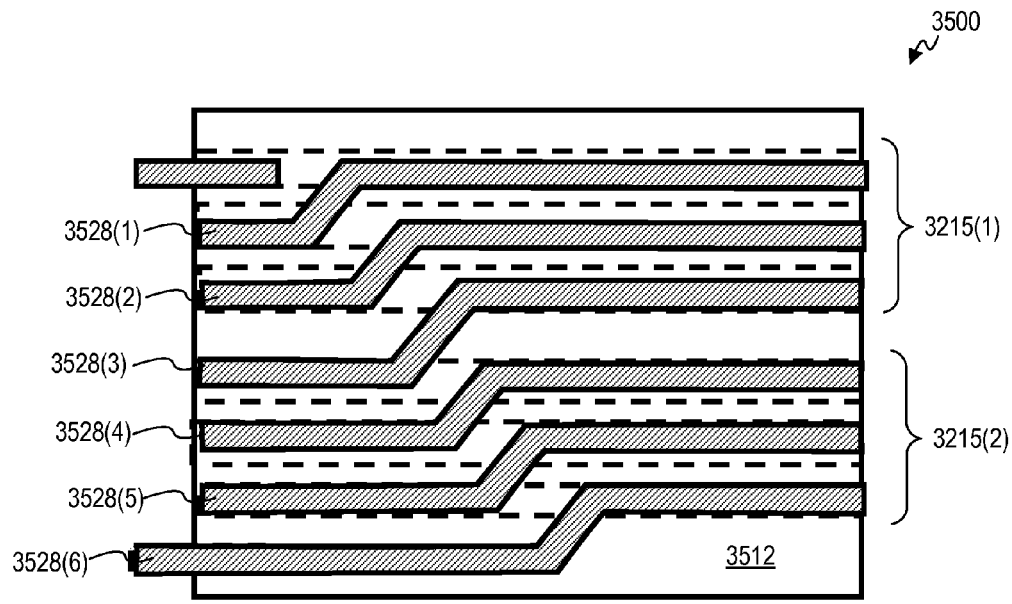
FIG. 35 shows a plan view of a portion of a bottom outer surface of an integrated circuit similar to that of FIG. 26, but including lead frame portions on the bottom outer surface to connect leads, according to an embodiment.
Figure 36:
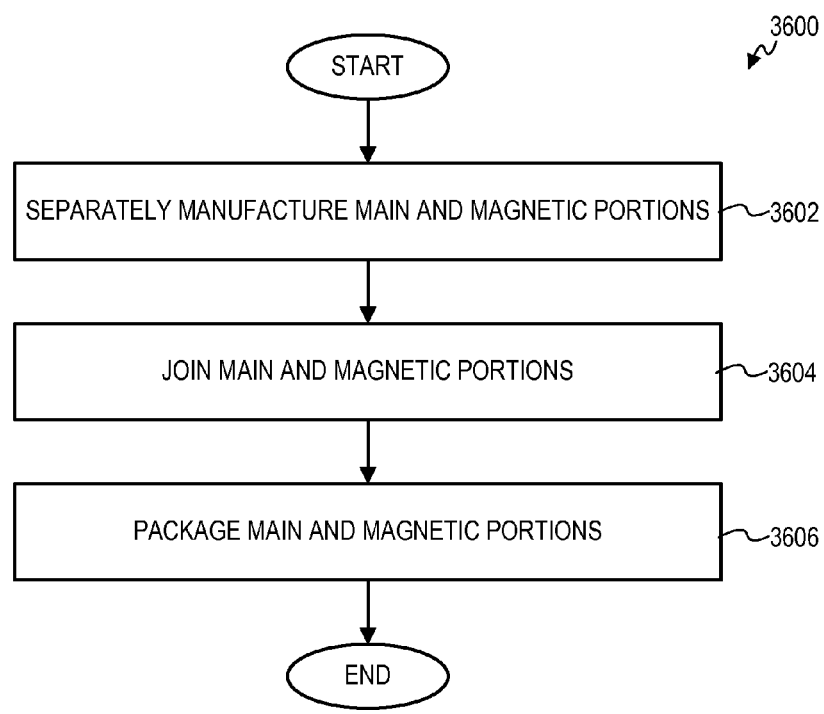
FIG. 36 shows a method for manufacturing an integrated circuit including a magnetic device, according to an embodiment.
Figure 37:
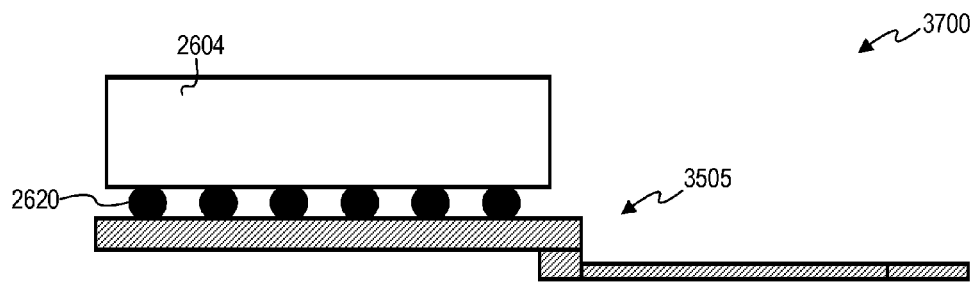
FIG. 37 shows a main portion of the FIG. 35 integrated circuit.
Figure 38:
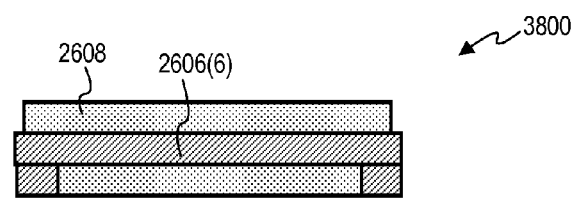
FIG. 38 shows a magnetic portion of the FIG. 35 integrated circuit.

In embodiments where leads are connected on the bottom outer surface by lead frame portions, such as in the FIG. 35 embodiment, the integrated circuit's magnetic portion is optionally formed separately from the remainder of the integrated circuit. For example, FIG. 36 shows a method 3600 for manufacturing an integrated circuit including a magnetic device, and FIGS. 37-41 illustrate integrated circuit 3500 being manufactured according to method 3600. Method 3600 begins with step 3602 of separately manufacturing a main portion of the integrated circuit and a magnetic portion of the integrated circuit. The main portion includes the semiconductor die and the lead frame, and the magnetic portion includes the magnetic core and the leads wound on or through the core. One example of step 3602 is reflected in FIGS. 37 and 38. FIG. 37 shows a main portion 3700 of integrated circuit 3500 including semiconductor die 2604 attached to a lead frame 3505, and FIG. 38 shows a magnetic portion 3800 of integrated circuit 3500 including magnetic core 2608 and leads 2606 wound around a portion of the core.

Figure 39:
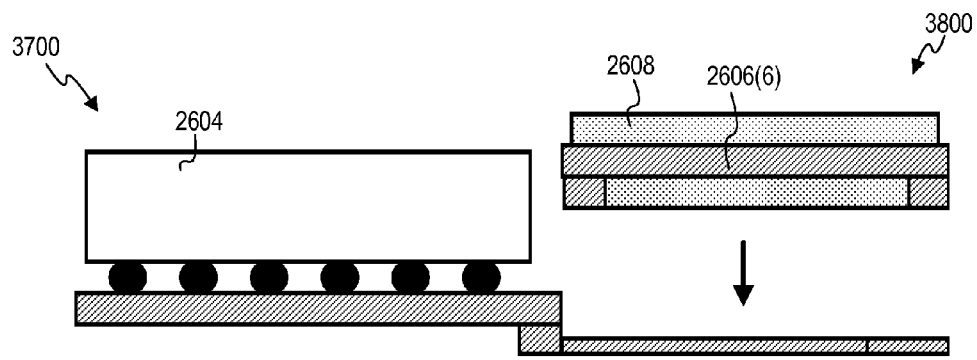
FIG. 39 illustrates the magnetic portion of FIG. 38 being joined to the main portion of FIG. 37.
Figure 40:
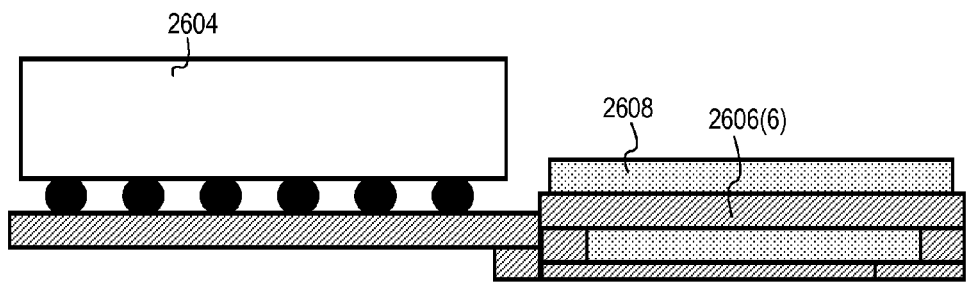
FIG. 40 shows the magnetic portion of FIG. 38 joined to the main portion of FIG. 37.
Figure 41:
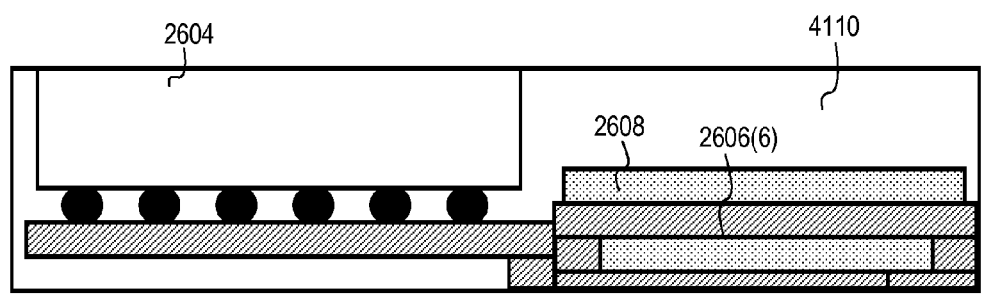
FIG. 41 shows the assembly of FIG. 40 after packaging.

In step 3604, the magnetic and main portions are joined to form one or more windings, where the windings include at least a portion of the lead frame and the leads wound on or through the core. One example of step 3604 is joining magnetic portion 3800 and main portion 3700, as illustrated in FIG. 39, and then welding or soldering leads of magnetic portion 3800 to leads of main portion 3700 to form a single assembly, as shown in FIG. 40, with windings 3215. In step 3606, the main and magnetic portions are packaged with integrated circuit packaging material to form an integrated circuit. An example of step 3606 is molding a polymer material 4110 around main portion 3700 and magnetic portion 3800, to create an integrated circuit package, shown in FIG. 41.

Although method 3600 is discussed with respect to integrated circuit 3500, the method is not limited to integrated circuit 3500, but could also be used to manufacture certain embodiments of the other integrated circuits disclosed herein. Additionally, it should be understood that the integrated circuits disclosed herein could be manufactured by methods other than method 3600. For example, in some embodiments, the magnetic cores are formed of discrete magnetic elements, such as ferrite magnetic elements, that are disposed in the integrated circuit during its manufacture.

The integrated circuits disclosed herein can be installed on printed circuit boards, such as to serve as a power supply for components on the board. For example, one or more of substrates 102, 502, 1602, and 2602 could be a printed circuit board, such as an information technology device motherboard. However, the integrated circuits disclosed herein could alternately be co-packaged with one or more other integrated circuit dies, such as to power the other dies.

Figure 42:
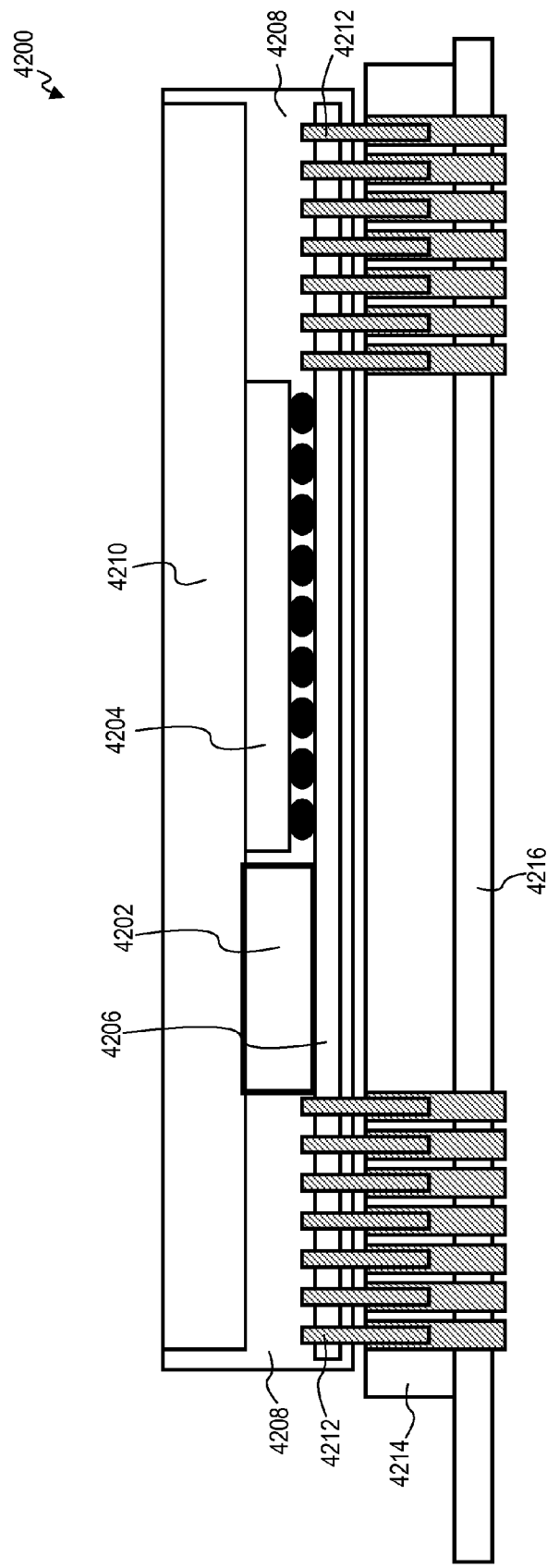
FIG. 42 shows a cross-sectional view of an integrated electronic assembly including an integrated circuit co-packaged with a semiconductor die, according to an embodiment.

For example, FIG. 42 shows a cross-sectional view of an integrated electronic assembly 4200 including an integrated circuit 4202 and a semiconductor die 4204 disposed on a common substrate 4206 and encapsulated by packaging material 4208 to form an assembly package. In some embodiments, packaging material 4208 includes a polymer material molded around the components of assembly 4200 by an injection molding process. Integrated circuit 4202 forms at least part of a switching power converter which at least partially powers semiconductor die 4204. Integrated circuit 4202 is, for example, one of integrated circuits 100, 500, 900, 1000, 1200, 1400, 1600, 2200, 2400, 2600, 3000, 3200, or 3500. In some embodiments, though, integrated circuit 4202 is not individually packaged, but is instead co-packaged with the other components of assembly 4200. For example, in certain embodiments where integrated circuit 4202 is integrated circuit 100 of FIG. 1, integrated circuit packaging material 110 is omitted such that integrated circuit 100 is not individually packaged, but is instead co-packaged with die 4204 and substrate 4206 using packaging material 4208.

Semiconductor die 4204 includes, for example, a processing device, such as a central processing unit or graphics processing unit, and/or an application specific integrated circuit (ASIC). Conductive traces of substrate 4206 optionally connect leads of integrated circuit 4202 to form a multi-turn inductor and/or coupled inductor in integrated circuit 4202. Such traces are analogous to conductors 528, 1028, 1228, 1428, 1628, 2228, 2428, 2628, 3028, and 3228 of FIGS. 8, 11, 13, 15, 19, 23, 25, 28, 31, and 33, respectively.

Figure 43:
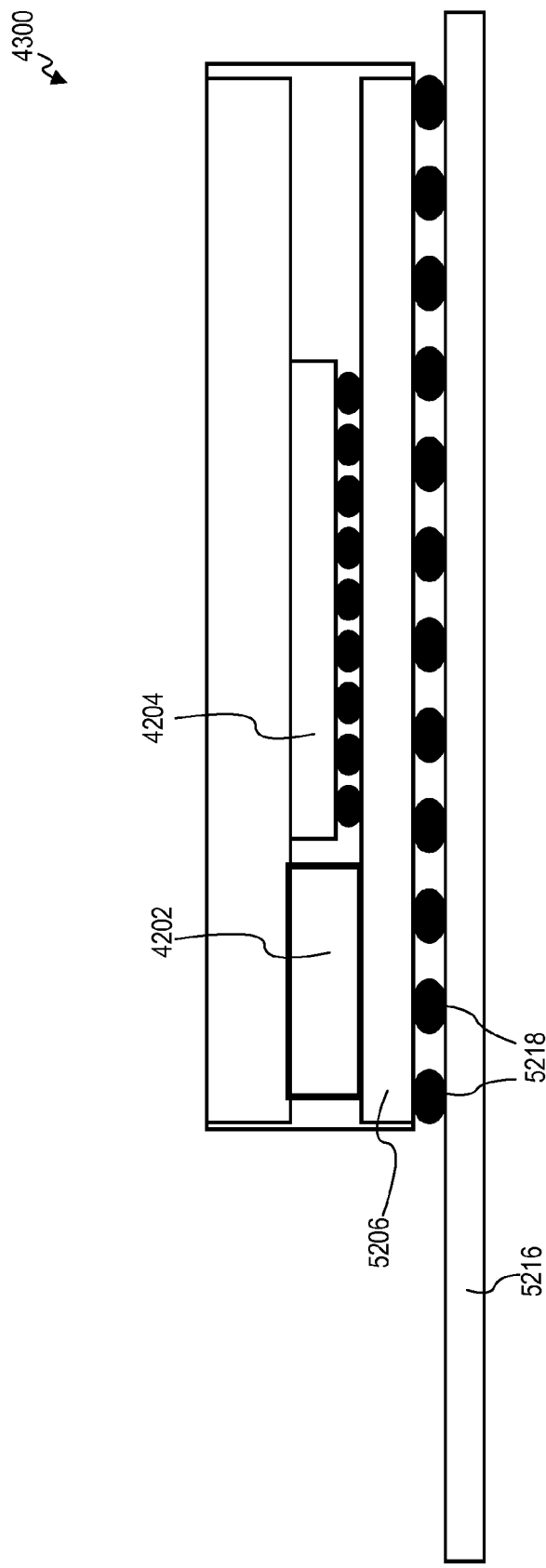
FIG. 43 shows a cross-sectional view of an integrated electronic assembly similar to that of FIG. 42, but directly soldered to a circuit board, according to an embodiment.

Electronic assembly 4200 further includes a heat sink plate 4210 and socket pins 4212. Heat sink plate 4210 is adapted to transfer heat away from integrated circuit 4202 and die 4204. In some embodiments, a heat sink, heat pipe, fan, other cooling device (not shown) is attached to heat sink plate 4210 to facilitate cooling assembly 4200. Socket pins 4212 provide an electrical interface to assembly 4200 and allow the assembly to be removable installed in a socket 4214, which is soldered to a circuit board 4216. In some alternate embodiments, though, socket pins 4212 are replaced with terminals adapted for surface mount soldering to substrate 4216, and assembly 4200 is disposed directly on circuit board 4216, instead of being coupled to the circuit board via socket 4214. For example, FIG. 43 shows a cross-sectional view of an integrated electronic assembly 4300, which is similar to assembly 4200 of FIG. 42, but includes a substrate 5206 directly soldered to a circuit board 5216 via solder balls 5218, thereby eliminating the need for a socket and associated socket pins.

Co-packaging integrated circuit 4202 with die 4204 eliminates losses and voltage drop/distortion in pins 4212 and socket 4214, which would be incurred if integrated circuit 4202 were external to assembly 4200. Thus, co-packing integrated circuit 4202 with die 4204 promotes high efficiency, tight voltage regulation, and fast converter transient response.

Use of one of the integrated circuits disclosed herein, instead of a conventional voltage regulator integrated circuit, may achieve one or more advantages. For example, assembly 4200 typically has severe component height restrictions, such as to prevent interference with heat sink plate 4210. Inductors are generally the tallest switching power converter components. Thus, use of a conventional voltage regulator integrated circuit may necessitate use of a smaller inductor core than optimal to meet height restrictions, particularly in situations where windings must be relatively thick to handle die 4204's current requirements. Use of a small core potentially results in high core losses and low inductor saturation current rating, as discussed above. The integrated circuits disclosed herein, however, potentially enable use of a relatively large magnetic core in a small package size, as discussed above. Thus, use of the integrated circuits disclosed herein may enable use of an optimally sized magnetic core, even with the height restrictions of assembly 4200.

As another example, in many of the integrated circuits disclosed herein, the winding turns are at least partially shielded by the magnetic core, and the magnetic core provides a complete path for magnetic flux loops, as discussed above. Shielding may prevent the need for an electrical insulator between the integrated circuit and external components. For example, if integrated circuit 4202 were replaced with an integrated circuit including exposed windings on its top outer surface, an insulator would typically be required to electrically isolate the windings from heat sink plate 4210. Eliminating the need for an insulator is desirable, for example, because insulators add to assembly cost, increase assembly manufacturing complexity, impede transfer of heat to heat sink plate 4210, and potentially reduce assembly reliability.

Providing a complete path for magnetic flux loops, in turn, minimizes losses and associated heating in nearby metallic components. For example, if integrated circuit 4200 did not provide a complete path for magnetic flux loops, flux flowing outside of the integrated circuit's core may induce circulating eddy currents in metallic components, such as heat sink plate 4210 and socket pins 4212. These currents would cause losses and associated heating in the metallic components, thereby reducing efficiency and potentially causing overheating. Additionally, magnetic flux outside of the core may also induce current in metallic conductors inside of die 4204 or in conductors coupled to die 4204, thereby potentially causing improper assembly operation. It should be appreciated that typical dielectric insulators would not prevent magnetic flux from coupling to nearby circuitry and metallic components. Instead, magnetic shielding would be required to prevent undesired coupling of magnetic flux to adjacent circuitry and components. Such magnetic shielding is typically bulky and costly.

Figure 44:
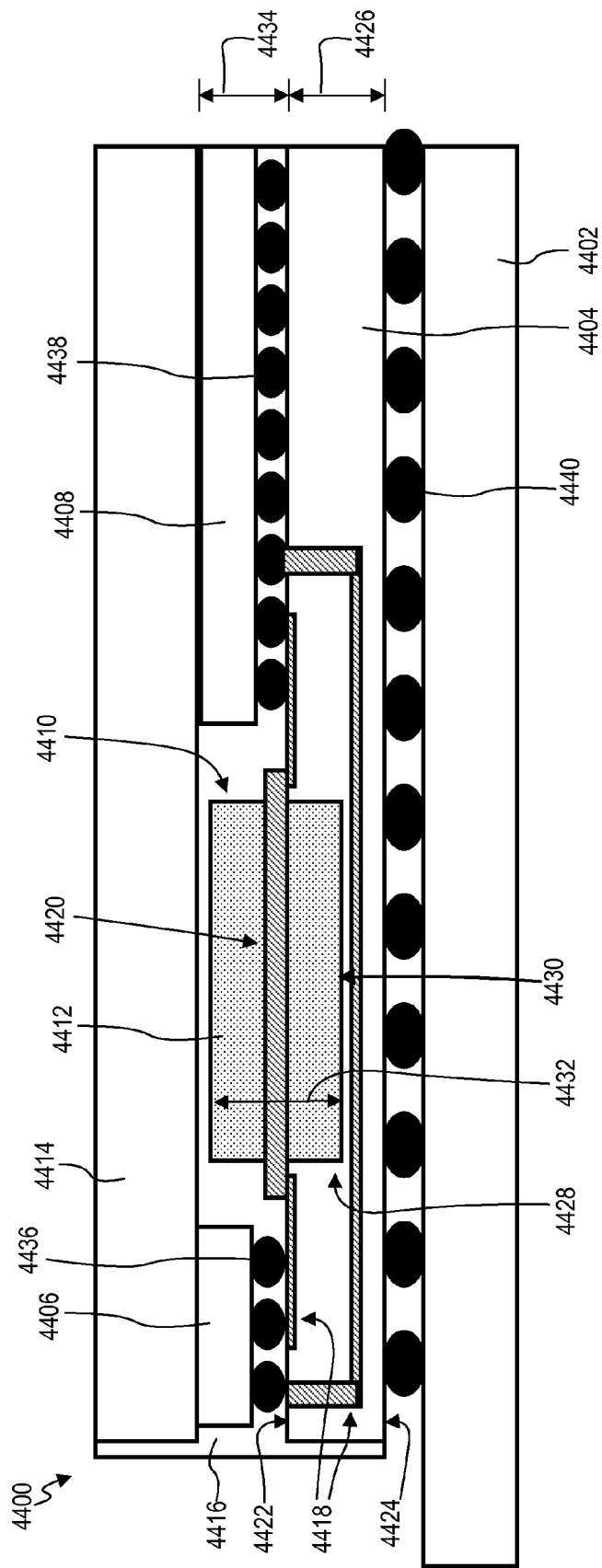
FIG. 44 shows a cross-sectional view of an integrated electronic assembly including a magnetic core disposed in a cut-out portion of a substrate, according to an embodiment.

Applicants have also developed integrated electronic assemblies including semiconductor dies and an inductor electrically coupled by connection circuitry. For example, FIG. 44 shows a cross-sectional view of an integrated electronic assembly 4400 disposed on a circuit board 4402. Assembly 4400 includes a substrate 4404, a first semiconductor die 4406, a second semiconductor die 4408, an inductor 4410 including a magnetic core 4412, a heat sink plate 4414, and packaging material 4416 at least partially encapsulating the substrate, the semiconductor dies, and the inductor to form an assembly package.

Second semiconductor die 4208 includes, for example, a processing device, such a central processing unit or graphics processing unit, and/or an ASIC. First semiconductor die 4406 includes at least one switching circuit. First semiconductor die 4406 and inductor 4410 collectively form at least part of a switching power converter adapted to at least partially power second semiconductor die 4408. In some embodiments, the switching power converter is a single-phase switching power converter, such as the buck DC-to-DC converter of FIG. 4. In some other embodiments, the switching power converter is a multi-phase switching power converter, such as the multi-phase buck DC-to-DC converter of FIG. 21.

Metallic connection circuitry 4418, which typically includes conductive traces of substrate 4404, electrically couples first semiconductor die 4406 and inductor 4410, and the connection circuitry also electrically couples the switching power converter and second semiconductor die 4408. In some embodiments, connection circuitry 4418 also forms some or all of the inductor's one or more windings 4420. The number and configuration of windings 4420 may vary without departing from the scope hereof. For example, in embodiments where first semiconductor die 4406 and inductor 4410 collectively form part of a single-phase switching power converter, inductor 4410 will typically have a single winding 4420. In contrast, in embodiments where first semiconductor die 4406 and inductor 4410 collectively form part of a multi-phase switching power converter, inductor 4410 will include one winding 4420 per phase, to form a coupled inductor. Connection circuitry 4418 may also vary without departing from the scope hereof.

Substrate 4404 has opposing first and second outer surfaces 4422, 4424 separated by a thickness 4426. First semiconductor die 4406 and second semiconductor die 4408 are each disposed on first outer surface 4422. Inductor 4410, in contrast, is disposed in a cut-out portion 4428 of substrate 4404 extending into substrate 4404 from surface 4422, such that a bottom outer surface 4430 of inductor 4410 is between substrate outer surfaces 4422, 4424, in the direction of substrate thickness 4426. Disposing inductor 4410 in substrate cut-out portion 4428 allows core 4412 to have a taller height 4432 than would typically otherwise be possible, due to component height restrictions in assembly 4400. For example, heat sink plate 4414, which is disposed on first semiconductor die 4406 and second semiconductor die 4408, typically limits height of components disposed on first outer surface 4422 to a maximum height 4434, which is lower than inductor height 4432. Thus, if inductor 4410 were disposed on outer surface 4422 instead of in cut-out portion 4428, the inductor's height would be limited to maximum height 4434, thereby necessitating use of a shorter magnetic core.

First semiconductor die 4406 and second semiconductor die 4408 are each surface mount soldered to substrate 4404 via solder balls 4436, 4438, respectively. Similarly, assembly 4400 is surface mount soldered to circuit board 4402 via solder balls 4440. In certain alternate embodiments, though, other connection types, such as thru-hole pins or socket connections, are used in conjunction with, or in place of, surface mount solder connections. Furthermore, in certain alternate embodiments, solder balls 4440 below inductor 4410 are relocated, and substrate cut-out portion 4428 extends through the entire thickness 4426 of substrate 4404. In these alternate embodiments, inductor bottom surface 4430 optionally extends from substrate second outer surface 4424 away from substrate 4404, thereby potentially enabling use of an even larger inductor magnetic core than shown in FIG. 44.

Figure 45:
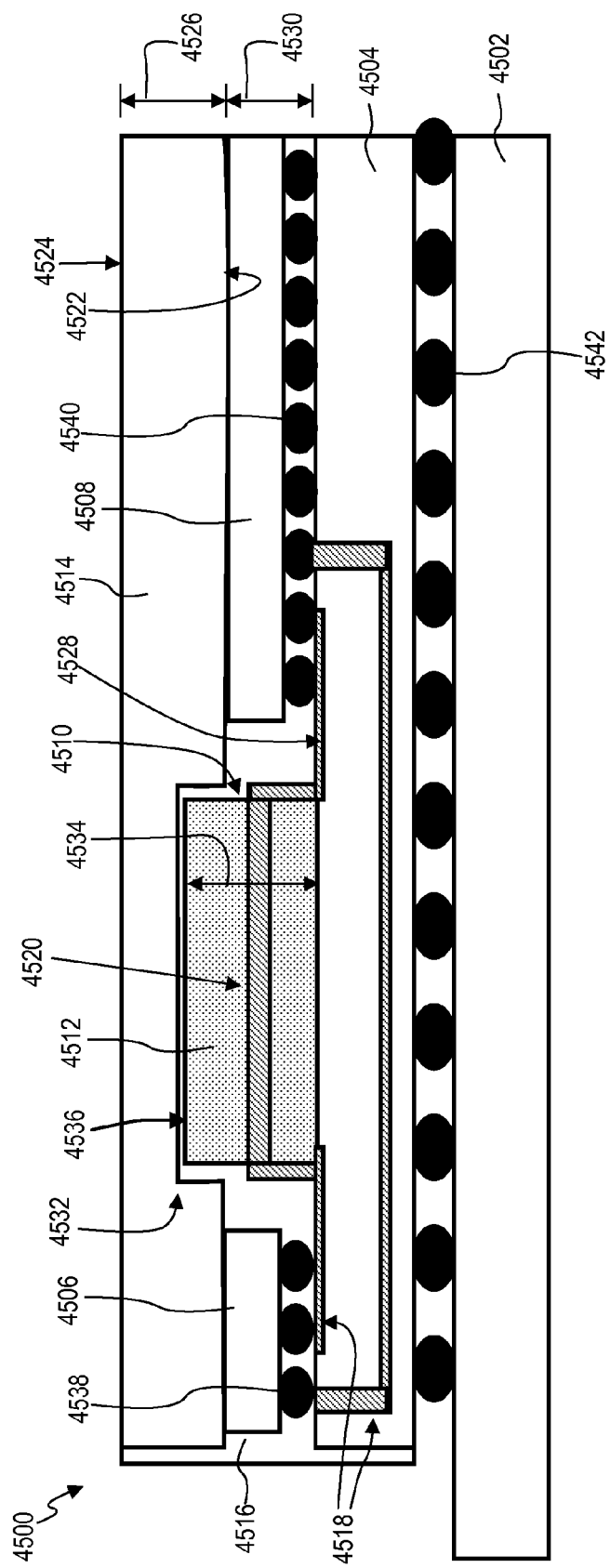
FIG. 45 shows a cross-sectional view of an integrated electronic assembly including a magnetic core disposed in a cut-out portion of a heat sink plate, according to an embodiment.

FIG. 45 shows a cross-sectional view of an integrated electronic assembly 4500 disposed on a circuit board 4502. Assembly 4500 includes a substrate 4504, a first semiconductor die 4506, a second semiconductor die 4508, an inductor 4510 including a magnetic core 4512, a heat sink plate 4514, and packaging material 4516 at least partially encapsulating the substrate, the semiconductor dies, and the inductor to form an assembly package.

Second semiconductor die 4508 includes, for example, a processing device, such as a central processing unit or graphics processing unit, and/or an ASIC. First semiconductor die 4506 includes at least one switching circuit. First semiconductor die 4506 and inductor 4510 collectively form at least part of a switching power converter adapted to at least partially power second semiconductor die 4508. In some embodiments, the switching power converter is a single-phase switching power converter, such as the buck DC-to-DC converter of FIG. 4. In some other embodiments, the switching power converter is a multi-phase switching power converter, such as the multi-phase buck DC-to-DC converter of FIG. 21.

Metallic connection circuitry 4518, which typically includes conductive traces of substrate 4504, electrically couples first semiconductor die 4506 and inductor 4510, and the connection circuitry also electrically couples the switching power converter and second semiconductor die 4508. In some embodiments, connection circuitry 4518 also forms some or all of the inductor's one or more windings 4520. The number and configuration of windings 4520 may vary without departing from the scope hereof. For example, in embodiments where first semiconductor die 4506 and inductor 4510 collectively form part of a single-phase switching power converter, inductor 4510 will typically have a single winding 4520. In contrast, in embodiments where first semiconductor die 4506 and inductor 4510 collectively form part of a multi-phase switching power converter, inductor 4510 will have include one winding 4520 per phase to form a coupled inductor. Connection circuitry 4518 may also vary without departing from the scope hereof.

Heat sink plate 4514 has opposing first and second outer surfaces 4522, 4524 separated by a thickness 4526. Heat sink plate 4514 is disposed on first and second semiconductor dies 4506, 4508, such that first outer surface 4522 faces the dies, to transfer heat away from the dies. Accordingly, heat sink plate 4514 generally limits components disposed on substrate outer surface 4528 to a maximum height 4530. However, heat sink plate 4514 includes a cut-out portion 4532 extending into the plate from outer surface 4522, and magnetic core 4512 extends into the cut-out portion, thereby allowing magnetic core 4512 to have a height 4534 that is taller than maximum height 4530. Thus, a top outer surface 4536 of magnetic core 4512 is between heat sink plate outer surfaces 4522, 4524, in the direction of plate thickness 4526.

First and second semiconductor dies 4506, 4508 are each surface mount soldered to substrate 4504 via solder balls 4538, 4540, respectively. Similarly, assembly 4500 is surface mount soldered to circuit board 4502 via solder balls 4542. In certain alternate embodiments, though, other connection types, such as thru-hole pins or socket connections, are used in conjunction with, or in place of, surface mount solder connections. Furthermore, in certain alternate embodiments, heat sink plate cut-out portion 4532 extends through the entire thickness 4526 of heat sink plate 4514. In these alternate embodiments, magnetic core top surface 4536 optionally extends from heat sink plate second outer surface 4524 away from plate 4514, thereby potentially allowing use of an even larger inductor magnetic core than shown in FIG. 45. Moreover, in some alternate embodiments, substrate 4504 includes a cut-out portion similar to that shown in FIG. 44, such that magnetic core 4512 extends into cut-out portions of both heat sink plate 4514 and substrate 4504.

Although the integrated circuits disclosed herein are discussed above as forming inductors, the integrated circuits could be modified to instead form transformers by maximizing winding coupling and minimizing leakage inductance. For example, integrated circuit 2600 of FIG. 26 could be modified to minimize winding separation distance 2641, as well as separation distances 2639 between leads within windings, thereby minimizing leakage inductance and maximizing winding coupling. Additionally, although the integrated circuits disclosed herein are shown as having a QFNL package, they could be modified to have a different integrated circuit package type, such as another type of surface mount package, or a package designed for insertion into a socket or thru-hole mounting. Accordingly, surface mount solder tabs could be replaced with another terminal type, such as socket pins or thru-hole pins.

Combinations of Features

Features described above as well as those claimed below may be combined in various ways without departing from the scope hereof. The following examples illustrate some possible combinations:

(A1) An integrated circuit may include a semiconductor die including one or more switching circuits, a magnetic core, a metallic lead wrapped around at least a portion of the magnetic core, and integrated circuit packaging material. The integrated circuit packaging material may encapsulate the semiconductor die, the magnetic core, and a portion of the metallic lead, to form an integrated circuit package. The metallic lead may have opposing first and second ends, where the first end is connected to the semiconductor die, and the second end terminates on an outer surface of the integrated circuit package.

(A2) In the integrated circuit denoted as (A1), the second end of the metallic lead may form a terminal on the outer surface of the integrated circuit package.

(A3) In the integrated circuit denoted as (A2), the terminal may include a solder tab adapted for surface mount soldering to a substrate.

(A4) In any of the integrated circuits denoted as (A1) through (A3), the semiconductor die may include a flip chip semiconductor die connected to the first end of the metallic lead via a solder connection.

(A5) In any of the integrated circuits denoted as (A1) through (A4), the one or more switching circuits, the metallic lead, and the magnetic core may collectively form at least part of a switching power converter.

(A6) In the integrated circuit denoted as (A5), the switching power converter may have a topology selected from the group consisting of a buck DC-to-DC converter, a boost DC-to-DC converter, and a buck-boost DC-to-DC converter.

(A7) In either of the integrated circuits denoted as (A5) or (A6), the one or more switching circuits may include a control transistor and a freewheeling transistor electrically coupled in series between an input power rail and a reference power rail of the integrated circuit, and the integrated circuit may further include: (1) an input capacitor electrically coupled between the input and reference power rails, (2) first driver circuitry adapted to cause the control transistor to switch between its conductive and non-conductive states, (3) a first driver capacitor electrically coupled to the first driver circuitry, (4) second driver circuitry adapted to cause the freewheeling transistor to switch between its conductive and non-conductive states, and (5) a second driver capacitor electrically coupled to the second driver circuitry.

(A8) In any of the integrated circuits denoted as (A1) through (A7), the metallic lead may be formed of a single piece of metal.

(B1) An integrated circuit may include a semiconductor die including one or more switching circuits, a magnetic core, a plurality of metallic leads wound through the magnetic core, and integrated circuit packaging material. The integrated circuit packaging material may encapsulate the semiconductor die, the magnetic core, and a portion of the plurality of metallic leads, to form an integrated circuit package. At least one of the leads may be electrically coupled to the semiconductor die, and the plurality of metallic leads may be electrically isolated from each other within the integrated circuit package.

(B2) In the integrated circuit denoted as (B1), at least one end of each of the plurality of metallic leads may terminate on an outer surface of the integrated circuit package.

(B3) In the integrated circuit denoted as (B1), at least one end of each of the plurality of metallic leads may form a solder tab, suitable for surface mount soldering to a substrate, on the outer surface of the integrated circuit package.

(B4) In any of the integrated circuits denoted as (B1) through (B3), the one or more switching circuits, the plurality of metallic leads, and the magnetic core may collectively form at least part of a switching power converter.

(B5) In the integrated circuit denoted as (B4), the switching power converter may have a topology selected from the group consisting of a buck DC-to-DC converter, a boost DC-to-DC converter, and a buck-boost DC-to-DC converter.

(B6) In either of the integrated circuits denoted as (B4) or (B5), the one or more switching circuits may include a control transistor and a freewheeling transistor electrically coupled in series between an input power rail and a reference power rail of the integrated circuit, and the integrated circuit may further include: (1) an input capacitor electrically coupled between the input and reference power rails, (2) first driver circuitry adapted to cause the control transistor to switch between its conductive and non-conductive states, (3) a first driver capacitor electrically coupled to the first driver circuitry, (4) second driver circuitry adapted to cause the freewheeling transistor to switch between its conductive and non-conductive states, and (5) a second driver capacitor electrically coupled to the second driver circuitry.

(C1) An integrated circuit may include a semiconductor die including one or more switching circuits, a magnetic core having length and width, first and second metallic leads, and integrated circuit packaging material. The first metallic lead may form a first winding turn around a portion of the magnetic core, and the first metallic lead may be electrically coupled to the semiconductor die. The second metallic lead may form a second winding turn around a portion of the magnetic core. The integrated circuit packaging material may encapsulate the semiconductor die, the magnetic core, and portions of the first and second metallic leads, to form an integrated circuit package, and the first and second winding turns may be offset from each other along both of the width and length of the magnetic core.

(C2) In the integrated circuit denoted as (C1), the first winding turn may be wound around a first center axis, the second winding turn may be wound around a second center axis, and the second center axis may be offset from the first center axis along the lengthwise direction of the magnetic core.

(C3) The integrated circuit denoted as (C2) may further include: (1) a third metallic lead forming a third winding turn around a portion of the magnetic core, and (2) a fourth metallic lead forming a fourth winding turn around a portion of the magnetic core. The third winding turn may be wound around the first center axis, the fourth winding turn may be wound around the second center axis, and the first, second, third, and fourth winding turns may be separated from each other along the widthwise direction of the magnetic core.

(C4) In any of the integrated circuits denoted as (C1) through (C3), each of the first and second winding turns may have a staple shape.

(C5) In any of the integrated circuits denoted as (C1) through (C4), at least one end of each of the first and second metallic leads may terminate on an outer surface of the integrated circuit package.

(C6) In any of the integrated circuits denoted as (C1) through (C5), the one or more switching circuits, the first and second metallic leads, and the magnetic core may collectively form at least part of a multi-phase switching power converter.

(C7) In the integrated circuit denoted as (C6), the switching power converter may have a topology selected from the group consisting of a multi-phase buck DC-to-DC converter, a multi-phase boost DC-to-DC converter, and a multi-phase buck-boost DC-to-DC converter.

(C8) In either of the integrated circuits denoted as (C6) or (C7), the one or more switching circuits may include at least two power stages, where each power stage includes a control transistor and a freewheeling transistor electrically coupled in series between an input power rail and a reference power rail of the integrated circuit. The integrated circuit may further include: (1) an input capacitor electrically coupled between the input and reference power rails of the integrated circuit, (2) respective first and second driver circuitry for each power stage, the first driver circuitry adapted to cause the control transistor of the power stage to switch between its conductive and non-conductive states, the second driver circuitry adapted to cause the freewheeling transistor of the power stage to switch between its conductive and non-conductive states, (3) a respective first driver capacitor electrically coupled to each first driver circuitry instance, and (4) a respective second driver capacitor electrically coupled to each second driver circuitry instance.

(D1) An integrated circuit may include a semiconductor die including one or more switching circuits, a magnetic core having length and width, first and second lead sets, and integrated circuit packaging material. Each lead set may include a plurality of metallic leads, where each metallic lead is wound around a portion of the magnetic core in the lengthwise direction of the magnetic core. At least one of the plurality of metallic leads may be electrically coupled to the semiconductor die. The integrated circuit packaging material may encapsulate the semiconductor die, the magnetic core, and a portion of the first and second lead sets, to form an integrated circuit package. The first and second lead sets may be non-overlapping and separated by a first separation distance, greater than each separation distance between adjacent metallic leads of the first and second lead sets, along the width of the magnetic core.

(D2) In the integrated circuit denoted as (D1), the one or more switching circuits, the first and second lead sets, and the magnetic core may collectively form at least part of a multi-phase switching power converter.

(D3) In the integrated circuit denoted as (D2), the multi-phase switching power converter may have a topology selected from the group consisting of a multi-phase buck DC-to-DC converter, a multi-phase boost DC-to-DC converter, and a multi-phase buck-boost DC-to-DC converter.

(D4) In either of the integrated circuits denoted as (D2) or (D3), the one or more switching circuits may include at least two power stages, where each power stage includes a control transistor and a freewheeling transistor electrically coupled in series between an input power rail and a reference power rail of the integrated circuit. The integrated circuit may further include: (1) an input capacitor electrically coupled between the input and reference power rails of the integrated circuit, (2) respective first and second driver circuitry for each power stage, where the first driver circuitry is adapted to cause the control transistor of the power stage to switch between its conductive and non-conductive states, and where the second driver circuitry is adapted to cause the freewheeling transistor of the power stage to switch between its conductive and non-conductive states, (3) a respective first driver capacitor electrically coupled to each first driver circuitry instance, and (4) a respective second driver capacitor electrically coupled to each second driver circuitry instance.

(E1) An integrated electronic assembly may include a substrate including a cut-out portion, first and second semiconductor dies disposed on the substrate, an inductor, metallic connection circuitry, and packaging material. The first semiconductor die may include one or more switching circuits, and the inductor may include a magnetic core extending at least partially into the cut-out portion of the substrate. The metallic connection circuitry may electrically couple the first and second semiconductor dies and the inductor, and the packaging material may encapsulate at least a portion of the substrate, the first and second semiconductor dies, the inductor, and the metallic connection circuitry, to form an assembly package.

(E2) In the integrated electronic assembly denoted as (E1), the one or more switching circuits, the inductor, and the metallic connection circuitry may collectively form at least part of a switching power converter adapted to at least partially power the second semiconductor die.

(E3) In the integrated electronic assembly denoted as (E2), the switching power converter may be a multi-phase switching power converter, and the inductor may be a coupled inductor.

(E4) In any of the integrated electronic assemblies denoted as (E1) through (E3), the second semiconductor die may include at least one of a processor device and an application specific integrated circuit.

(E5) In any of the integrated electronic assemblies denoted as (E1) through (E4): the substrate may have opposing first and second outer surfaces separated by a thickness of the substrate; the first and second semiconductor dies may be disposed on the first outer surface of the substrate; and the magnetic core may extend into the cut-out portion of the substrate such that an outer surface of the magnetic core is between the first and second outer surfaces of the substrate, in a direction of the thickness of the substrate.

(E6) In any of the integrated electronic assemblies denoted as (E1) through (E5), the metallic connection circuitry may include one or more conductive traces of the substrate.

(F1) An integrated electronic assembly may include a substrate, first and second semiconductor dies disposed on the substrate, a heat sink plate disposed on the first and second semiconductor dies, an inductor, metallic connection circuitry electrically coupling the first and second semiconductor dies and the inductor, and packaging material. The first semiconductor die may include one or more switching circuits. The heat sink plate may include a cut-out portion, and the inductor may include a magnetic core disposed on the substrate and extending at least partially into the cut-out portion of the heat sink plate. The packaging material may encapsulate at least part of the substrate, the first and second semiconductor dies, the inductor, and the first metallic connection circuitry, to form an assembly package.

(F2) In the integrated electronic assembly denoted as (F1), the one or more switching circuits, the inductor, and the metallic connection circuitry may collectively form at least part of a switching power converter adapted to at least partially power the second semiconductor die.

(F3) In the integrated electronic assembly denoted as (F2), the switching power converter may be a multi-phase switching power converter, and the inductor may be a coupled inductor.

(F4) In any of the integrated electronic assemblies denoted as (F1) through (F3), the second semiconductor die may include at least one of a processor device and an application specific integrated circuit.

(F5) In any of the integrated electronic assemblies denoted as (F1) through (F4): the heat sink plate may have opposing first and second outer surfaces separated by a thickness of the heat sink plate; the heat sink plate may be disposed on the first and second semiconductor dies such that the first outer surface faces the first and second semiconductor dies; and the magnetic core may extend into the cut-out portion of the heat sink plate such that a top outer surface of the magnetic core is between the first and second outer surfaces of the heat sink plate, in a direction of the thickness of the heat sink plate.

(F6) In any of the integrated electronic assemblies denoted as (F1) through (F5), the metallic connection circuitry may include one or more conductive traces of the substrate.

(F7) In any of the integrated electronic assemblies denoted as (F1) through (F6), the substrate may include a cut-out portion, and the magnetic core may extend at least partially into the cut-out portion of the substrate.

(G1) An integrated electronic assembly may include a substrate and an integrated circuit disposed on the substrate. The integrated circuit may include a first semiconductor die including one or more switching circuits, a magnetic core, and a metallic lead wrapped around at least a portion of the magnetic core. The metallic lead may have a first end connected to the semiconductor die and a second end, opposite of the first end, connected to the substrate.

(G2) The integrated electronic assembly denoted as (G1) may further include a second semiconductor die disposed on the substrate. The substrate may include one or more conductive traces electrically coupling the second end of the metallic lead to the second semiconductor die.

(G3) In the integrated electronic assembly denoted as (G2), the one or more switching circuits, the magnetic core, and the metallic lead may collectively form at least part of a switching power converter adapted to at least partially power the second semiconductor die.

(G4) In the integrated electronic assembly denoted as (G3), portions of the one or more conductive traces of the substrate may be wound on the magnetic core, such that the metallic lead, portions of the one or more conductive traces, and the magnetic core collectively form an inductor of the switching power converter.

(G5) Either of the integrated electronic assemblies denoted as (G2) through (G4) may further include packaging material encapsulating at least part of the substrate, the integrated circuit, and the second semiconductor die, to form an assembly package.

(G6) In any of the integrated electronic assemblies denoted as (G2) through (G5), the second semiconductor die may include at least one of a processor device and an application specific integrated circuit.

(G7) In any of the integrated electronic assemblies denoted as (G1) through (G6), the first semiconductor die may include a flip chip semiconductor die connected to the first end of the metallic lead via a solder connection.

(H1) An integrated electronic assembly may include a substrate and an integrated circuit disposed on the substrate. The integrated circuit may include a first semiconductor die including one or more switching circuits, a magnetic core having length and width, and first and second metallic leads. The first metallic lead may form a first winding turn around a portion of the magnetic core, and the first metallic lead may be electrically coupled to the semiconductor die. The second metallic lead may form a second winding turn around a portion of the magnetic core, and the first and second winding turns may be offset from each other along both of the width and length of the magnetic core.

(H2) The integrated electronic assembly denoted as (H1) may further include a second semiconductor die disposed on the substrate and electrically coupled to the integrated circuit.

(H3) In the integrated electronic assembly denoted as (H2), the one or more switching circuits, the magnetic core, and the first and second metallic leads may collectively form at least part of a switching power converter adapted to at least partially power the second semiconductor die.

(H4) Either of the integrated electronic assemblies denoted as (H2) or (H3) may further include packaging material encapsulating at least part of the substrate, the integrated circuit, and the second semiconductor die, to form an assembly package.

(H5) In any of the integrated electronic assemblies denoted as (H2) through (H4), the second semiconductor die may include at least one of a processor device and an application specific integrated circuit.

(H6) In any of the integrated electronic assemblies denoted as (H1) through (H5), the first winding turn may be wound around a first center axis, the second winding turn may be wound around a second center axis, and the second center axis may be offset from the first center axis along the lengthwise direction of the magnetic core.

(H7) In any of the integrated electronic assemblies denoted as (H1) through (H6), each of the first and second winding turns may have a staple shape.

(H8) In any of the integrated electronic assemblies denoted as (H1) through (H7), the magnetic core and the first and second metallic leads may collectively form at least part of a coupled inductor.

(I1) An integrated electronic assembly may include a substrate including conductive traces and an integrated circuit disposed on the substrate. The integrated circuit may include a first semiconductor die including one or more switching circuits, a magnetic core having length and width, and first and second windings electrically coupled to the first semiconductor die. Each winding may include a plurality of metallic leads electrically coupled in series by the conductive traces of the substrate, where each metallic lead is wound around a portion of the magnetic core in a lengthwise direction of the magnetic core. The first and second windings may be non-overlapping and separated by a first separation distance, greater than each separation distance between adjacent metallic leads of the first and second windings, along the width of the magnetic core.

(I2) The integrated electronic assembly denoted as (I1) may further include a second semiconductor die disposed on the substrate and electrically coupled to the integrated circuit.

(I3) In the integrated electronic assembly denoted as (I2), the one or more switching circuits, the magnetic core, and the first and second windings may collectively form at least part of a switching power converter adapted to at least partially power the second semiconductor die.

(I4) Either of the integrated electronic assemblies denoted as (I2) or (I3) may further include packaging material encapsulating at least part of the substrate, the integrated circuit, and the second semiconductor die, to form an assembly package.

(I5) In any of the integrated electronic assemblies denoted as (I2) through (I5), the second semiconductor die may include at least one of a processor device and an application specific integrated circuit.

(I6) In any of the integrated electronic assemblies denoted as (I1) through (I5), the magnetic core and the first and second windings may collectively form at least part of a coupled inductor.

Changes may be made in the above methods, systems, and devices without departing from the scope hereof. For example, a flip-chip semiconductor die could be replaced with a semiconductor die which is attached to a lead frame via bond wires. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. An integrated circuit, comprising:
a semiconductor die including one or more switching circuits;
a magnetic core having length and width;
a first metallic lead forming a first winding turn around a portion of the magnetic core, the first metallic lead being electrically coupled to the semiconductor die;
a second metallic lead forming a second winding turn around a portion of the magnetic core; and
integrated circuit packaging material encapsulating the semiconductor die, the magnetic core, and portions of the first and second metallic leads, to form an integrated circuit package;
the first and second winding turns being offset from each other along both of the width and length of the magnetic core.

2. The integrated circuit of claim 1, wherein:
the first winding turn is wound around a first center axis;
the second winding turn is wound around a second center axis; and
the second center axis is offset from the first center axis along the lengthwise direction of the magnetic core.

3. The integrated circuit of claim 2, further comprising:
a third metallic lead forming a third winding turn around a portion of the magnetic core, the third winding turn being wound around the first center axis;
a fourth metallic lead forming a fourth winding turn around a portion of the magnetic core, the fourth winding turn being wound around the second center axis; and
the first, second, third, and fourth winding turns being separated from each other along the widthwise direction of the magnetic core.

4. The integrated circuit of claim 2, each of the first and second winding turns having a staple shape.

5. The integrated circuit of claim 1, at least one end of each of the first and second metallic leads terminating on an outer surface of the integrated circuit package.

6. The integrated circuit of claim 1, the one or more switching circuits, the first and second metallic leads, and the magnetic core collectively forming at least part of a multi-phase switching power converter.

7. The integrated circuit of claim 6, the switching power converter having a topology selected from the group consisting of a multi-phase buck DC-to-DC converter, a multi-phase boost DC-to-DC converter, and a multi-phase buck-boost DC-to-DC converter.

8. The integrated circuit of claim 6, wherein:
the one or more switching circuits comprise at least two power stages, each power stage including a control transistor and a freewheeling transistor electrically coupled in series between an input power rail and a reference power rail of the integrated circuit; and
the integrated circuit further comprises:
an input capacitor electrically coupled between the input and reference power rails of the integrated circuit,
respective first and second driver circuitry for each power stage, the first driver circuitry adapted to cause the control transistor of the power stage to switch between its conductive and non-conductive states, the second driver circuitry adapted to cause the freewheeling transistor of the power stage to switch between its conductive and non-conductive states,
a respective first driver capacitor electrically coupled to each first driver circuitry instance, and
a respective second driver capacitor electrically coupled to each second driver circuitry instance.

9. An integrated electronic assembly, comprising:
a substrate; and
an integrated circuit disposed on the substrate, the integrated circuit including:
a first semiconductor die including one or more switching circuits,
a magnetic core having length and width,
a first metallic lead forming a first winding turn around a portion of the magnetic core, the first metallic lead being electrically coupled to the semiconductor die, and
a second metallic lead forming a second winding turn around a portion of the magnetic core,
the first and second winding turns being offset from each other along both of the width and length of the magnetic core.

10. The integrated electronic assembly of claim 9, further comprising:
a second semiconductor die disposed on the substrate and electrically coupled to the integrated circuit;
wherein the one or more switching circuits, the magnetic core, and the first and second metallic leads collectively form at least part of a switching power converter adapted to at least partially power the second semiconductor die.

11. The integrated electronic assembly of claim 10, further comprising packaging material encapsulating at least part of the substrate, the integrated circuit, and the second semiconductor die, to form an assembly package.

12. The integrated electronic assembly of claim 11, wherein:
the first winding turn is wound around a first center axis;
the second winding turn is wound around a second center axis; and
the second center axis is offset from the first center axis along the lengthwise direction of the magnetic core.

13. The integrated electronic assembly of claim 10, each of the first and second winding turns having a staple shape.

14. The integrated electronic assembly of claim 10, the second semiconductor die comprising at least one of a processor device and an application specific integrated circuit.

15. The integrated electronic assembly of claim 10, the magnetic core and the first and second metallic leads collectively forming at least part of a coupled inductor.

* * * * *